(12) United States Patent
Noguchi et al.

(10) Patent No.: US 9,105,618 B2
(45) Date of Patent: Aug. 11, 2015

(54) SEMICONDUCTOR DEVICE

(71) Applicant: Kabushiki Kaisha Toshiba, Minato-ku (JP)

(72) Inventors: Mitsuhiro Noguchi, Kanagawa (JP); Masayuki Akou, Kanagawa (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/166,093

(22) Filed: Jan. 28, 2014

(65) Prior Publication Data

US 2015/0076625 A1 Mar. 19, 2015

(30) Foreign Application Priority Data

Sep. 17, 2013 (JP) ................................. 2013-192415

(51) Int. Cl.
*H01L 29/49* (2006.01)
*H01L 29/423* (2006.01)
*H01L 27/115* (2006.01)

(52) U.S. Cl.
CPC ...... *H01L 29/4941* (2013.01); *H01L 27/11541* (2013.01); *H01L 29/42376* (2013.01)

(58) Field of Classification Search
CPC ............ H01L 29/66825; H01L 29/401; H01L 29/4941; H01L 27/11541; H01L 29/42376; H01L 29/42324; H01L 29/42328; G11C 11/5621; G11C 14/0018; G11C 14/0063; G11C 16/0408; G11C 16/0416; G11C 2216/06; G11C 2216/10; G11C 2229/763
See application file for complete search history.

(56) References Cited

U.S. PATENT DOCUMENTS

| | | | |
|---|---|---|---|
| 7,863,191 B2 | 1/2011 | Tanaka | |
| 7,968,924 B2 * | 6/2011 | Sato | 257/296 |
| 2001/0020718 A1 * | 9/2001 | Takahashi et al. | 257/326 |
| 2002/0070402 A1 * | 6/2002 | Ichige et al. | 257/296 |
| 2004/0014286 A1 * | 1/2004 | Park | 438/264 |
| 2004/0214394 A1 * | 10/2004 | Shimizu | 438/257 |
| 2006/0138463 A1 * | 6/2006 | Kim et al. | 257/202 |
| 2008/0165582 A1 * | 7/2008 | Georgescu et al. | 365/185.05 |
| 2009/0146701 A1 * | 6/2009 | Noguchi et al. | 327/144 |
| 2010/0065900 A1 * | 3/2010 | Murata et al. | 257/314 |
| 2010/0301425 A1 * | 12/2010 | Kang et al. | 257/384 |

(Continued)

FOREIGN PATENT DOCUMENTS

| | | |
|---|---|---|
| JP | 2001-127158 | 5/2001 |
| JP | 2008-85124 | 4/2008 |
| JP | 2013-38341 | 2/2013 |

*Primary Examiner* — Jarrett Stark
*Assistant Examiner* — Bitew Dinke
(74) *Attorney, Agent, or Firm* — Oblon, McClelland, Maier & Neustadt, L.L.P.

(57) ABSTRACT

A semiconductor device according to an embodiment includes a gate wire including a laminated film in which a polysilicon film, a barrier conductive film, and a metal film are laminated in this order; a first contact plug/upper layer wire arranged above the source or the drain; a second upper layer wire arranged above an element isolation region; a second contact plug arranged apart from the second upper layer wire and connecting the metal film and the polysilicon film above a channel region; and a third contact plug formed apart from the polysilicon film in the element isolation region and connecting the second upper layer wire and the metal film. The second contact plug includes a barrier metal in contact with the polysilicon film and the barrier conductive film is made of WN, TaN, or Ta and the barrier metal is made of Ti or TiN.

19 Claims, 13 Drawing Sheets

(56) References Cited

U.S. PATENT DOCUMENTS

| | | | |
|---|---|---|---|
| 2011/0101439 A1* | 5/2011 | Park et al. | 257/316 |
| 2011/0309422 A1* | 12/2011 | Endo et al. | 257/314 |
| 2011/0312172 A1* | 12/2011 | Park et al. | 438/594 |
| 2012/0037971 A1* | 2/2012 | Kwon et al. | 257/296 |
| 2012/0104465 A1* | 5/2012 | Kim et al. | 257/225 |
| 2012/0199896 A1* | 8/2012 | Noguchi et al. | 257/296 |
| 2012/0243358 A1* | 9/2012 | Sugimae et al. | 365/205 |
| 2013/0037876 A1 | 2/2013 | Omoto | |
| 2013/0062682 A1* | 3/2013 | Endo et al. | 257/324 |
| 2013/0221422 A1* | 8/2013 | Noda et al. | 257/316 |
| 2014/0035017 A1* | 2/2014 | Kwon et al. | 257/296 |
| 2014/0183689 A1* | 7/2014 | Sung | 257/530 |
| 2014/0231896 A1* | 8/2014 | Matsumori et al. | 257/316 |

* cited by examiner

SEMICONDUCTOR DEVICE

CROSS-REFERENCE TO RELATED APPLICATION

This application is based upon and claims the benefit of priority from Japanese Patent Application No. 2013-192415 filed on Sep. 17, 2013 in Japan, the entire contents of which are incorporated herein by reference.

FIELD

Embodiments described herein relate generally to a semiconductor device.

BACKGROUND

A memory cell of EEPROM normally has a MISFET structure in which a charge accumulation layer and a control gate are stacked on a semiconductor substrate. The memory cell stores data in a nonvolatile manner based on a difference of the threshold voltage of a state in which the charge accumulation layer is filled with charges and the threshold voltage of a state in which charges are discharged. Charges are injected and discharged by a tunneling current via a tunnel dielectric film between the charge accumulation layer and a substrate channel. Among EEPROM, so-called NAND type EEPROM constituting a NAND cell unit by connecting a plurality of memory cells in series can be made denser because the number of selection transistors needed is smaller than in NOR type EEPROM. Also in a NOR type flash memory, data is erased by passing a tunneling current via a tunnel dielectric film between the charge accumulation layer and the substrate channel to suppress a short channel effect during an erase cycle. For example, to increase the number of memory cells erased in the unit time, data is erased simultaneously from a plurality of memory cells.

In a memory device, for example, a circuit that rearranges in series data read simultaneously from a plurality of the above NAND cell units to do input/output at high speed is provided. A MOS transistor for high-speed input/output of, for example, 200 Mbps (Mbps: Mega bit per second) to 400 Mbps is desired.

Incidentally, a MOS transistor having a gate in a laminated structure of, for example, a metal layer made of tungsten (W), a barrier metal layer made of tungsten nitride (WN), and a polysilicon layer from the upper layer side to reduce wire resistance of the gate has been known.

However, when a gate in such a laminated structure is formed, the resistance of the laminated structure between the barrier metal layer such as WN and the polysilicon layer is large and a problem in high-speed operation is caused. Such a problem is generally caused in a logic circuit such as a NAND circuit and NOR circuit. For example, the problem is also caused in an inverter circuit or a circuit used by connecting a plurality of logic circuits in series in a synchronous operation circuit used in a high-speed interface circuit.

DETAILED DESCRIPTION

Figure 1:
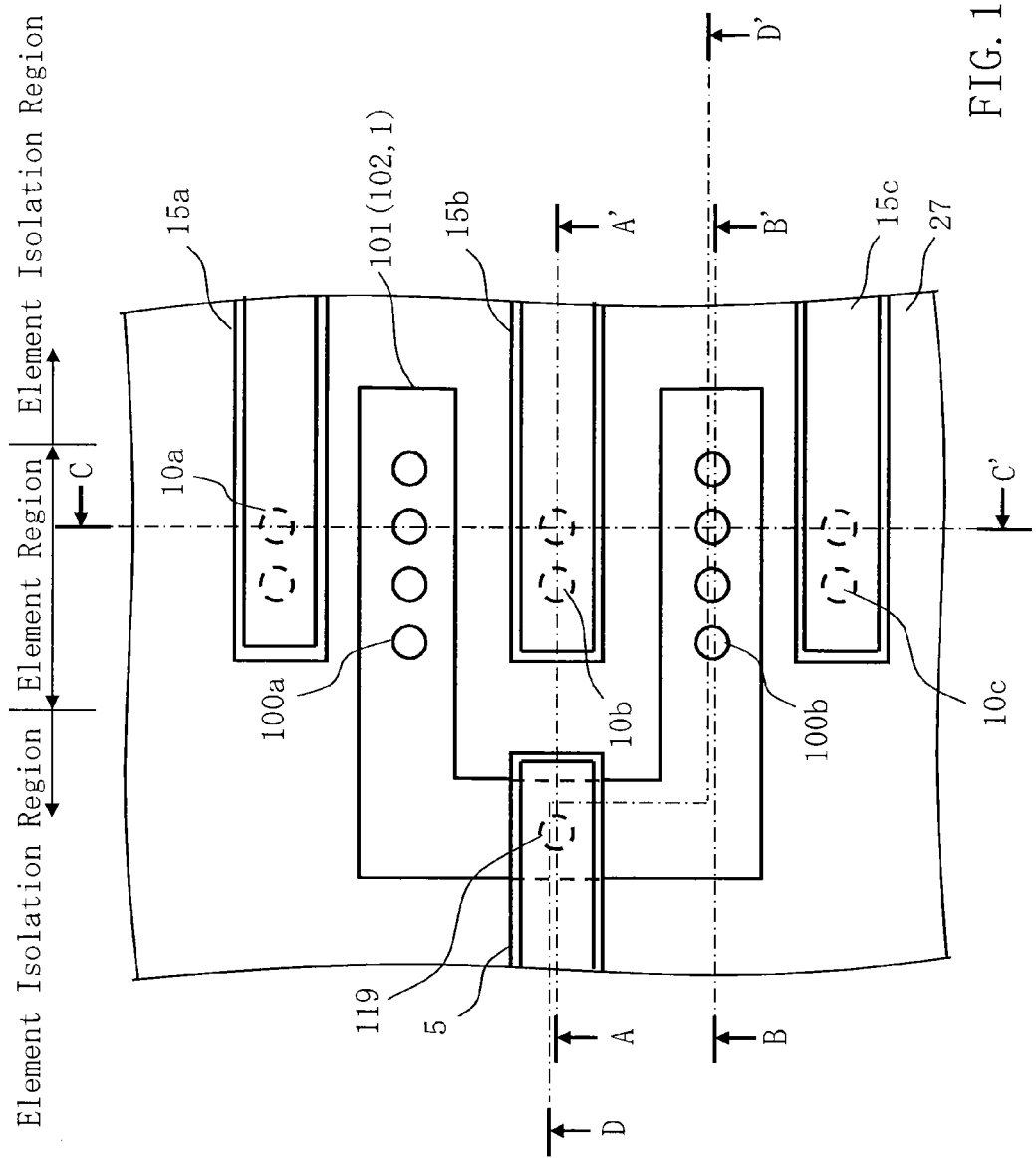
FIG. 1 is a top view showing a configuration of a semiconductor device according to a first embodiment.

A semiconductor device according to an embodiment includes a gate wire, a first contact plug, a first upper layer wire, a second upper layer wire, a second contact plug, and a third contact plug. The gate wire extends from a channel region into an element isolation region and includes a laminated film in which a polysilicon film, a barrier conductive film, and a metal film are laminated in this order from a lower layer side. The first contact plug is connected to a source or a drain adjacent to the channel region. The first upper layer wire is arranged above the source or the drain and connected to the first contact plug. The second upper layer wire is arranged above the element isolation region. The second contact plug is arranged apart from the second upper layer wire and connects the metal film and the polysilicon film above the channel region. The third contact plug is formed apart from the polysilicon film in the element isolation region and connects the second upper layer wire and the metal film. The second contact plug includes a barrier metal in contact with the polysilicon film and the barrier conductive film in the gate wire is made of at least one of tungsten nitride (WN), tantalum nitride (TaN), and tantalum (Ta) and the barrier metal in the second contact plug is made of at least one of titanium (Ti) and titanium nitride (TiN).

A semiconductor device according to an embodiment includes a gate wire, a first contact plug, a first upper layer wire, and a second contact plug. The gate wire includes a laminated film in which a polysilicon film, a barrier conductive film, and a metal film are laminated in this order from a lower layer side above a channel region. The first contact plug is connected to a source or a drain adjacent to the channel region. The first upper layer wire is arranged above the source or the drain and connected to the first contact plug. The second contact plug connects the metal film and the polysilicon film above the channel region and is formed in dimensions so as to be longer in a channel width direction than in a channel length direction and to be longer than the first contact plug in the channel width direction. The second contact plug includes a barrier metal in contact with the polysilicon film and the barrier conductive film in the gate wire is made of at least one of tungsten nitride (WN), tantalum nitride (TaN), and tantalum (Ta) and the barrier metal in the second contact plug is made of at least one of titanium (Ti) and titanium nitride (TiN).

In the embodiments described below, semiconductor devices capable of reducing wire resistance of a gate in a transistor having a gate comprising a laminated structure of a metal layer, a barrier metal layer, and a polysilicon layer will be described.

First Embodiment

In the first embodiment, a case when a contact plug arranged on a gate wire has a circular shape or a rectangular shape close to a square will be described.

Also in the first embodiment, as an example of the semiconductor device, a MOS transistor that performs a high-speed operation of data from a NAND cell unit in a nonvolatile NAND type flash memory device will be described. The MOS transistor described below is also valid for other logical circuits such as a NAND circuit and NOR circuit. For example, the MOS transistor is valid for an inverter circuit or a circuit used by connecting a plurality of logic circuits in series in a synchronous operation circuit used in a high-speed interface circuit. The first embodiment will be described below using drawings.

Figure 2:
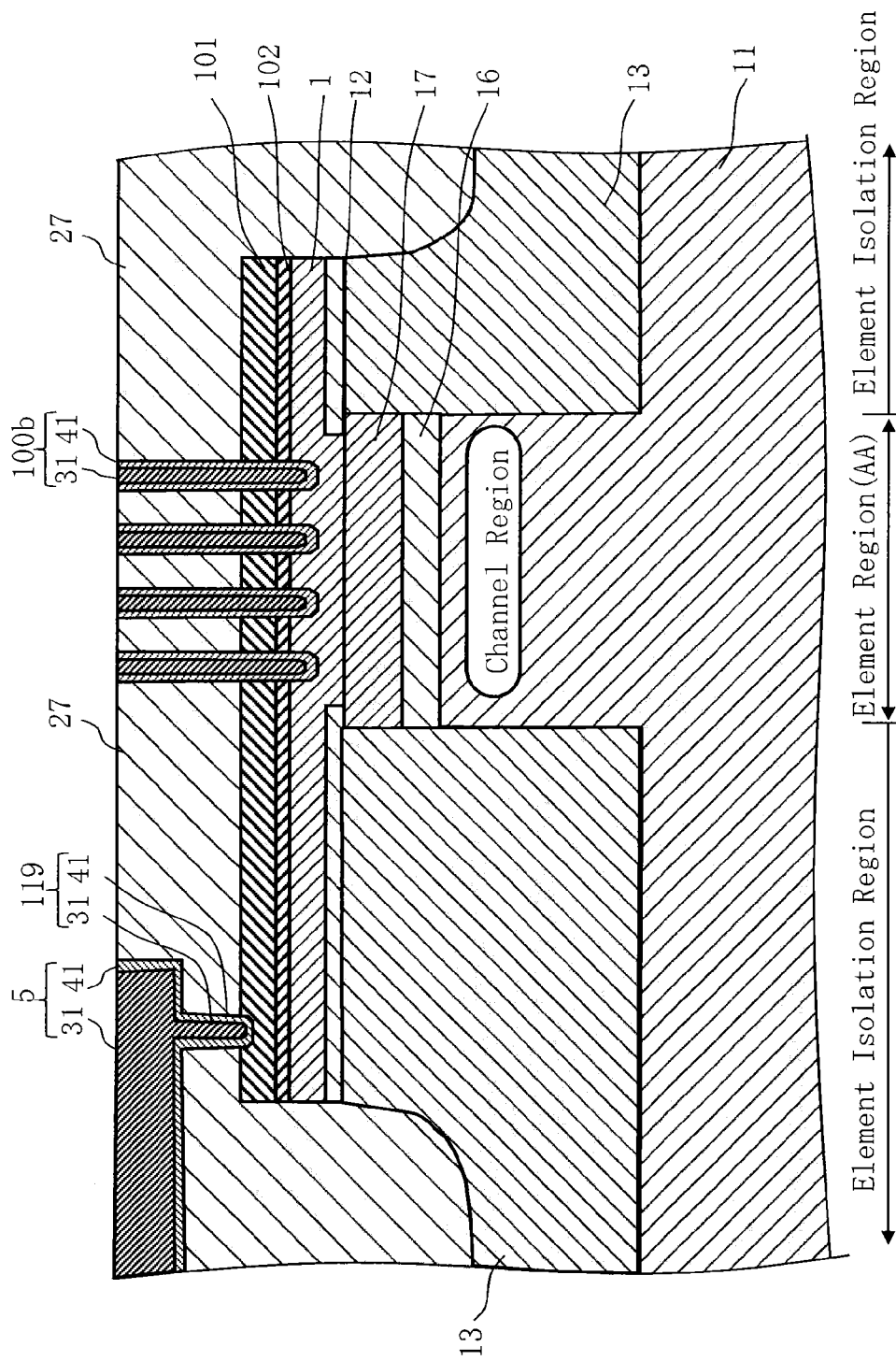
FIG. 2 is a sectional view showing a DD' cross section of the semiconductor device according to the first embodiment shown in FIG. 1.
Figure 3:
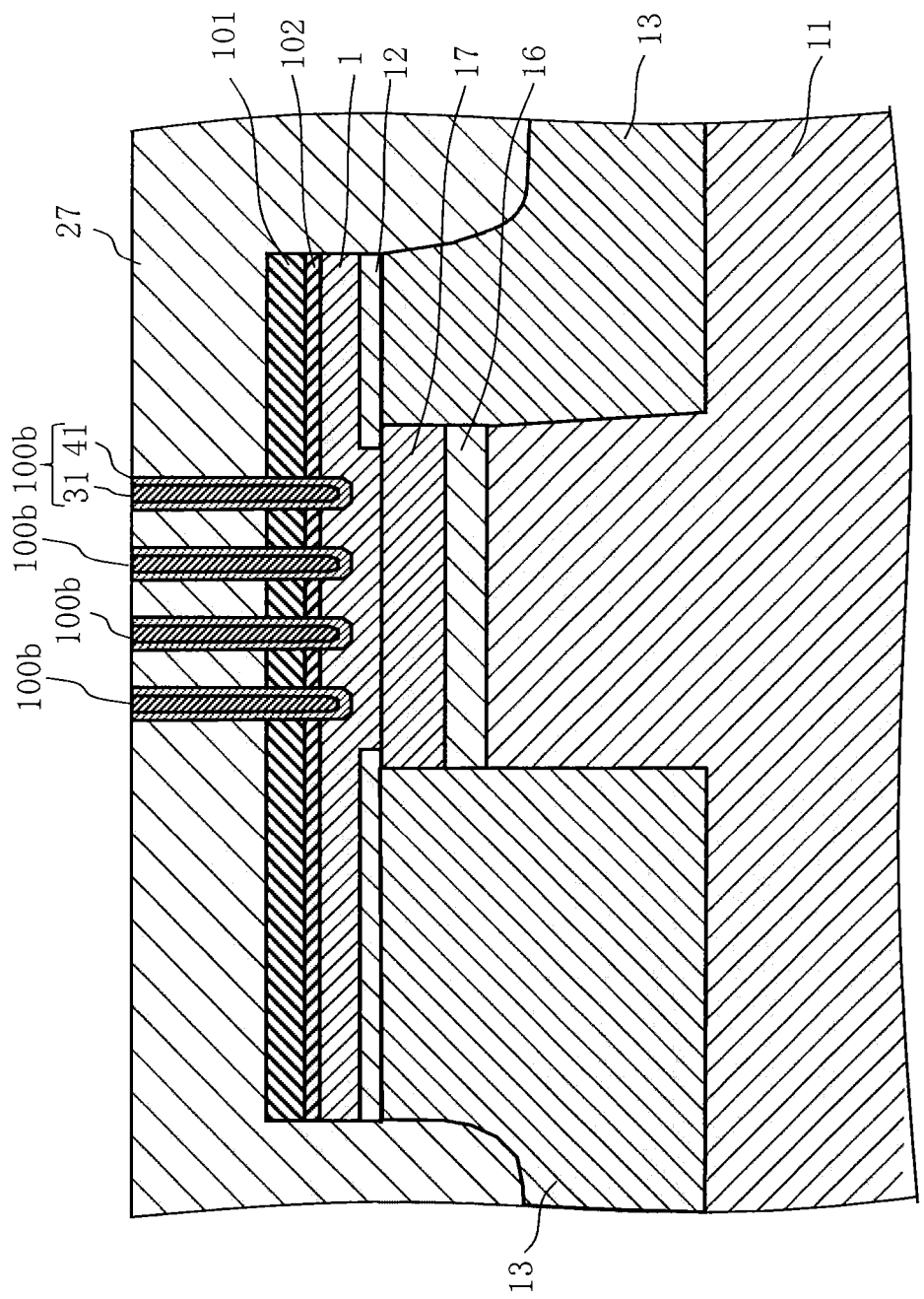
FIG. 3 is a sectional view showing a BB' cross section of the semiconductor device according to the first embodiment shown in FIG. 1.
Figure 4:
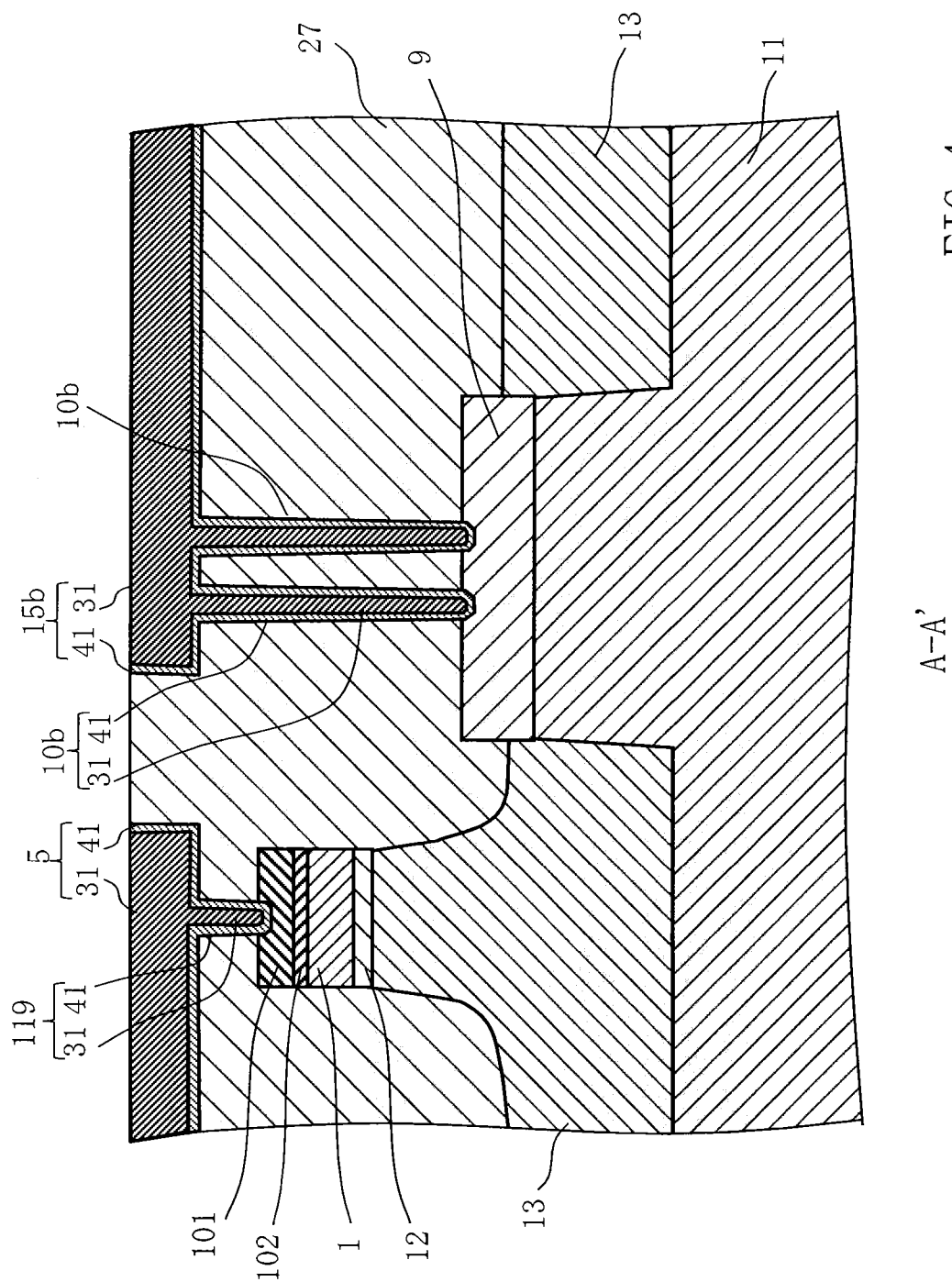
FIG. 4 is a sectional view showing an AA' cross section of the semiconductor device according to the first embodiment shown in FIG. 1.
Figure 5:
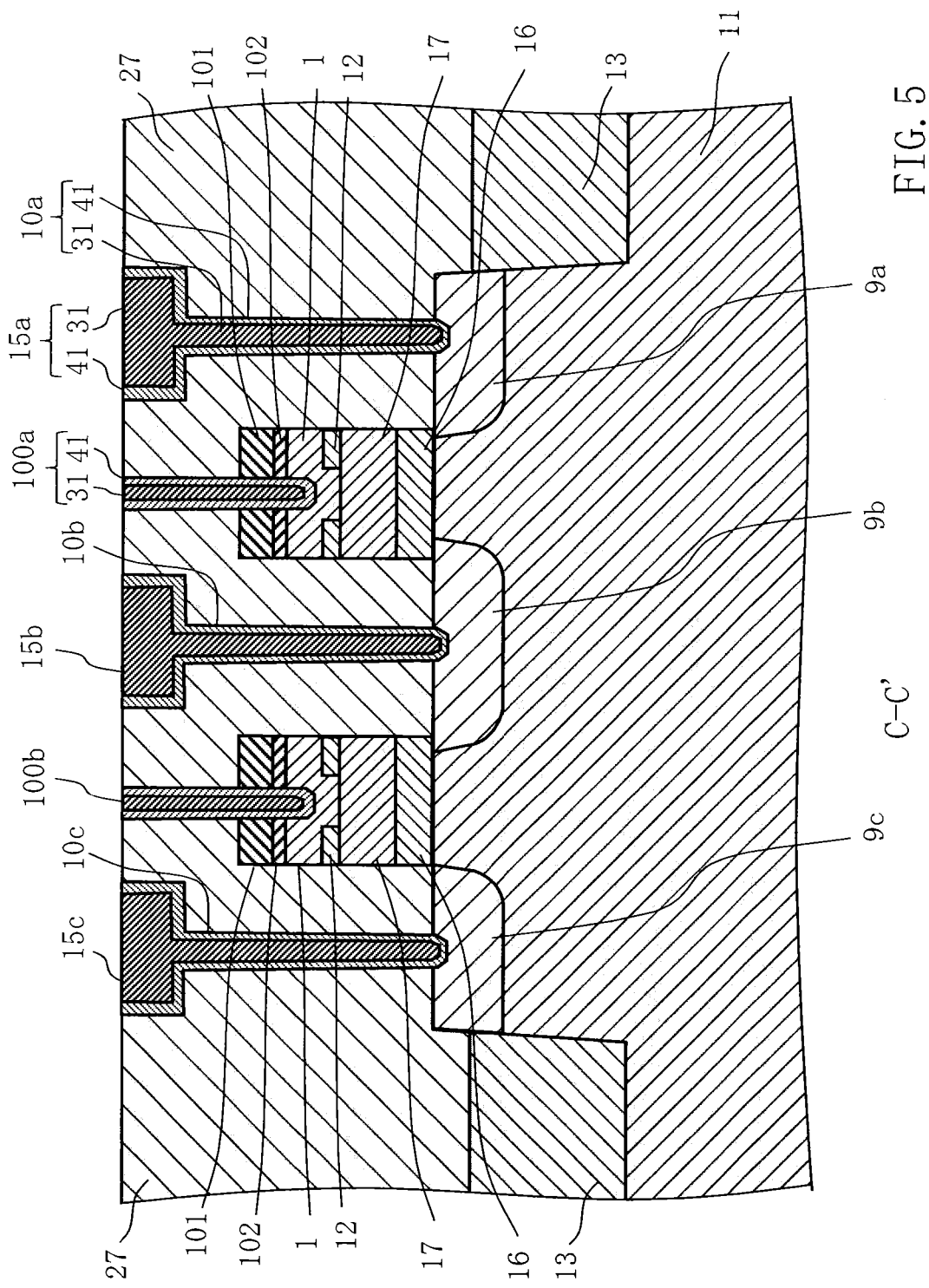
FIG. 5 is a sectional view showing a CC' cross section of the semiconductor device according to the first embodiment shown in FIG. 1.

FIG. 1 is a top view showing the configuration of a semiconductor device according to the first embodiment. FIG. 2 is a sectional view showing a DD' cross section of the semiconductor device according to the first embodiment shown in FIG. 1. FIG. 3 is a sectional view showing a BB' cross section of the semiconductor device according to the first embodiment shown in FIG. 1. FIG. 4 is a sectional view showing an AA' cross section of the semiconductor device according to the first embodiment shown in FIG. 1. FIG. 5 is a sectional view showing a CC' cross section of the semiconductor device according to the first embodiment shown in FIG. 1. In FIG. 2, the cross section position is changed in an element isolation region to make features of the first embodiment more understandable.

First, a cross section configuration of an element region will be described. As shown in FIGS. 2, 3, and 5, a gate dielectric film 16 is arranged on a semiconductor substrate 11. A p-type or n-type silicon (Si) substrate can be used as the semiconductor substrate 11. For example, a p-type Si substrate is used here. As the impurity concentration of a p-type semiconductor substrate, a p-type impurity, for example, boron (B) is suitably added such that the peak concentration in a region from the surface to the depth of 1 μm is in the range of, for example, $1\times10^{15}$ cm$^{-3}$ or more and $1\times10^{18}$ cm$^{-3}$ or less. Accordingly, the threshold voltage of the transistor can be set to, for example, 0 V or more and 2 V or less.

As the gate dielectric film 16, for example, a silicon oxide film or silicon oxynitride film of the thickness in the range of, for example, 2 nm to 10 nm is suitably used.

A conductive film 17 is formed on the gate dielectric film 16 by using, for example, the chemical vapor deposition (CVD) method to a thickness of, for example, 10 nm to 500 nm. The conductive film 17 is formed as a film of the same material as that of a floating gate (FG) of a NAND memory cell (not shown) formed simultaneously. For example, a polysilicon film is suitably used as the conductive film 17. The floating gate (FG) of a NAND memory cell (not shown) and the conductive film 17 are suitably formed such that the difference thereof in thickness is in the range of 0 nm to 10 nm. With the floating gate (FG) of a NAND memory cell (not shown) and the conductive film 17 formed from the same material (polysilicon), an element isolation process and a gate electrode process can simultaneously be performed in the same process content as the process in the memory cell region so that an increase of processes can be prevented. As the material of the conductive film 17, for example, a conductive polysilicon film to which phosphorus (P) or arsenic (As) is added in the concentration in the range of $10^{18}$ cm$^{-3}$ to $10^{21}$ cm$^{-3}$ or a conductive polysilicon film to which boron (B) is added in the concentration in the range of $10^{18}$ cm$^{-3}$ to $10^{21}$ cm$^{-3}$ is suitably used.

As the fabricating method heretofore, an n-type well to be a well of a NAND memory cell (not shown) is first formed in the semiconductor substrate 11 by ion implantation from the surface of the semiconductor substrate 11. Subsequently, a p-type well is formed by ion implantation into the n-type well. Subsequently, the gate dielectric film 16 and the conductive film 17 are successively deposited on the entire surface of the semiconductor substrate 11. Subsequently, patterning is performed so that an opening (trench) is formed halfway through the semiconductor substrate 11 while leaving the gate dielectric film 16 and the conductive film 17 of the gate width in the channel width direction. Then, an element isolation dielectric film 13 is deposited so as to completely bury the opening. Subsequently, by polishing and removing the excessive element isolation dielectric film 13 protruding from the opening by the chemical-mechanical polishing (CMP) method, as shown in FIGS. 2, 3, and 4, the element isolation in the channel width direction is completed. Accordingly, the conductive film 17 and a floating gate electrode of a NAND memory cell (not shown) can be formed as a plane in which a height step is controlled to be small. In this step, by processing the conductive film 17 as a plane in which the height step is controlled to be small, the height step of a laminated film can be made small when the laminated film in a gate structure described later is formed. Accordingly, a difference of time when etching is finished between a location where the laminated film of the gate structure is high and a location where the laminated film is low can be made smaller. In other words, the etching time can be matched. On the other hand, if etching is performed by matching to a portion where the gate is high when the height step of the laminated film is large, gate etching is performed excessively in a portion where the gate is low, leading to over-etching. If etching is finished by matching to a portion where the gate is low, the etching residue arises in a portion where the gate is high. Thus, as shown in the first embodiment, the gate etching residue can be made smaller by making the height step when the gate is processed smaller. In addition, so-called "substrate damage" by over-etching can be made smaller.

Further, the element isolation dielectric film 13 can be formed in a plane shape in which the height step from the top surface of the conductive film 17 is controlled to be small. Accordingly, the side face of the gate dielectric film 16 can be covered with the element isolation dielectric film 13 so that a problem of degraded reliability of the gate dielectric film 16 due to exposure of the side face of the gate dielectric film 16 after the height of the element isolation dielectric film 13 falls during gate etching and a problem of the falling threshold voltage of a transistor can be avoided. As the element isolation dielectric film 13, for example, a silicon oxide film, more specifically, a HDP (High-Deposition-rate Plasma) silicon oxide film, a silicon oxide film made of TEOS, a silicon oxide film formed from PSZ (polysilazane), or a silicon oxide film formed by combining these silicon oxide films can suitably be used.

A block dielectric film 12 (interpoly dielectric film) is formed on the conductive film 17 and the FG of a NAND memory cell (not shown). As the material of the block dielectric film 12, for example, a silicon oxide film of the thickness of 5 nm to 30 nm, a silicon oxynitride film, a laminated film of silicon oxide film/silicon nitride film/silicon oxide film, a single film of $Al_2O_3$, HfSix, AlSix, HfAlOx, HfOx, or TiOx, or a laminated film of a film of $Al_2O_3$, HfSix, AlSix, HfAlOx, HfOx, or TiOx and a silicon oxide film, silicon nitride film, or silicon oxynitride film can suitably be used. In a transistor to be a peripheral circuit shown in the first embodiment, as shown in FIGS. 2, 3, and 5, the block dielectric film 12 on the conductive film 17 is open.

A conductive polysilicon film 1 to be one material of the gate wire is formed on the block dielectric film 12 by using, for example, the CVD method in the range of, for example, 5 nm to 100 nm. As the polysilicon film 1, for example, a conductive polysilicon film to which P, As, or B is added in the concentration ranging from $1 \times 10^{17}$ to $5 \times 10^{21}$ cm$^{-3}$ can suitably be used.

A barrier metal film 102 (barrier conductive film) is formed on the polysilicon film 1 by using, for example, a sputter process in the range of 1 nm to 10 nm. As the material of the barrier metal film 102, for example, at least one of tungsten nitride (WN), tantalum nitride (TaN), and tantalum (Ta) can suitably be used.

A metal film 101 to be another material of the gate wire is formed on the barrier metal film 102 by using, for example, the sputter process to a thickness in the range of 5 nm to 100 nm. As the material of the metal film 101, for example, tungsten (W) can suitably be used. In addition to tungsten (W), copper (Cu) can also be suitably used. With the barrier metal film 102 formed between the metal film 101 and the conductive polysilicon film 1, the metal film 101 and the conductive polysilicon film 1 can be prevented from coming into direct contact with each other. As a result, a phenomenon in which reaction products WSi are generated by direct contact of the metal film 101 and the conductive polysilicon film 1 and volume expansion or shrinkage increases defects can be prevented. Further, by inserting the barrier metal film 102 therebetween, the low-resistance metal film 101 can be formed by aligning the crystal orientation of the metal film 101.

After a laminated film in which the polysilicon film 1, the barrier metal film 102, and the metal film 101 are laminated from the lower layer side is formed, the laminated film is patterned to form an opening (trench) until the semiconductor substrate 11 is exposed at predetermined intervals in the channel length (gate length) direction by the etching method. In the first embodiment, as shown in FIG. 1, a case when two transistors are patterned to share a gate wire (gate electrode) is shown. However, the present embodiment is not limited to such an example and may be applied to one transistor or further, a plurality of transistors.

The gate wire extends, as shown in FIG. 1, from the channel region inside the element region of one transistor of two transistors in the channel width direction into the element isolation region. Then, the gate wire turns around in the element isolation region to extend onto the channel region inside the element region of the other transistor of two transistors. Thus, in the first embodiment, as shown in FIG. 1, an example in which gate wires of two transistors are connected in the element isolation region is shown.

An n-type diffusion layer 9 to be a source electrode and a drain electrode is formed on the exposed surface of the semiconductor substrate 11. For example, ions of phosphorus, arsenic, or antimony is suitably injected into the diffusion layer 9 such that the surface concentration thereof is, for example, $10^{18}$ cm$^{-3}$ to $10^{22}$ cm$^{-3}$ and the junction depth thereof is formed, for example, in the range of 40 nm to 500 nm. In the first embodiment, an example is shown in which two transistors sharing the gate wire (gate electrode) share, as shown in FIG. 5, a source or drain electrode and are connected. In other words, a region between channels of a plurality of transistors (elements) is used as a source or drain electrode shared among the plurality of transistors. However, the present embodiment is not limited to such an example and the source and drain electrodes may individually be formed for each transistor element. Alternatively, a plurality of at least three transistors may successively be connected by sharing a source or drain electrode.

Then, an inter-level dielectric isolation 27 is formed inside the opening (trench) and on the gate wire by using, for example, the CVD method. For example, the inter-level dielectric isolation 27 is formed on the gate wire to a thickness of 100 nm to 1 μm. After the inter-level dielectric isolation 27 is deposited, the entire surface thereof is suitably planarized by polishing by the CMP method. As the material of the inter-level dielectric isolation 27, for example, a silicon oxide film, a silicon nitride film, a silicate glass film such as BPSG, BSG, or PSG, an HSQ film, an MSQ film, or an organic low-dielectric constant film can suitably be used.

When Cu is used for the metal film 101, Cu is formed after a heating process of, for example, 800° C. or more to form the source and drain electrode of a transistor to prevent Cu from diffusing to the side of the semiconductor substrate 11 to cause a leakage current or increase defects. Thus, after the polysilicon film 1 is formed, patterning is performed to form an opening (trench) until the semiconductor substrate 11 is exposed at predetermined intervals in the channel length direction by the etching method. Then, after the diffusion layer 9 is formed, a dielectric film is formed in the opening and on the polysilicon film 1. Thereafter, the damascene method may be used to form the Cu metal film 101 patterned to match the gate wire. In this case, the barrier metal film 102 may be formed at the bottom and sidewall of the Cu film to prevent Cu diffusion. Then, for example, after a diffusion barrier film of SiN or the like is formed on the Cu film, a dielectric film may further be deposited to form the inter-level dielectric isolation 27 having the predetermined thickness.

From the foregoing, a transistor for a peripheral circuit in the first embodiment having substantially the same structure as a memory cell transistor (not shown) can be formed. What is different is that the polysilicon film 1 contained in the control gate and the conductive film 17 are connected via the opening formed in the block dielectric film 12. Accordingly, the polysilicon film 1 and the conductive film 17 are integrated and can be used as one layer of a laminated film of a gate structure.

In the first embodiment, a contact plug (or a contact electrode) and an upper layer wire are formed. First, a contact plug 10 (first contact plug) is connected to the diffusion layer 9 to be a source or drain adjacent to the channel region. The contact plug 10 is formed in a circular shape or a rectangular shape close to a square and is arranged in the inter-level dielectric isolation 27 inside the element region. As shown in FIGS. 1 and 4, for example, one end side of the two contact plugs 10 arranged in a direction parallel to the channel width direction is connected to each of the diffusion layers 9. In the example of FIGS. 1, 4, and 5, two contact plugs 10a are connected to a diffusion layer 9a. Two contact plugs 10b are connected to a diffusion layer 9b. Two contact plugs 10c are connected to a diffusion layer 9c.

The other end side of pairs of the contact plugs 10 is connected to an upper layer wire 15 (first upper layer wire) arranged above the diffusion layer 9 to be a source or drain and extending in a direction parallel to the channel width direction. The upper layer wire 15 is formed for each of the diffusion layers 9. In addition, the upper layer wire 15 is arranged like being embedded in the inter-level dielectric isolation 27. The upper layer wire 15 is arranged such that the surface thereof is in the same height position as the surface of the inter-level dielectric isolation 27. In the example of FIGS. 1, 4, and 5, the two contact plugs 10a are connected to an upper layer wire 15a. The two contact plugs 10b are connected to an upper layer wire 15b. The two contact plugs 10c are connected to an upper layer wire 15c.

A contact plug 119 (third contact plug) is formed on the metal film 101 in the element isolation region. The contact plug 119 is formed in a circular shape or a rectangular shape close to a square and is arranged in the inter-level dielectric isolation 27 inside the element isolation region. One end of the contact plug 119 is directly connected to the metal film 101 without reaching the polysilicon 1 in the element isolation region.

The other end of the contact plug 119 is connected to the upper layer wire 5 (second upper layer wire) arranged above or "in" the element isolation region and extending in a direction parallel to the channel width direction. The contact plug 119 connects the upper layer wire 5 and the metal film 101 in the element isolation region. The upper layer wire 5 is arranged like being embedded in the inter-level dielectric isolation 27. The upper layer wire 5 is arranged such that the surface thereof is in the same height position as the surface of the inter-level dielectric isolation 27. In the example of FIG. 1, the upper layer wire 5 is arranged on an extension of an upper layer wire 15b arranged above or "in" the diffusion layer shared by two transistor in the element isolation region. However, the present embodiment is not limited to such an example and the upper layer wire 5 may be arranged to extend in a direction non-parallel to the channel width direction.

From the foregoing, a voltage can be applied to the gate wire of two transistors via the upper layer wire 5 and the contact plug 119. In addition, a voltage can be applied to the diffusion layer 9 via a set of the upper layer wire 15 and the contact plug 10.

Further, in the first embodiment, a contact plug 100 (second contact plug) that connects the metal film 101 and the polysilicon film 1 is arranged in the channel region inside the element region without being connected to the upper layer wire 5. The contact plug 100 is formed in a circular shape or a rectangular shape close to a square and is arranged in the inter-level dielectric isolation 27 inside the element region. As shown in FIGS. 1, 2, 3, and 5, one end side of a set of the four contact plugs 100 arranged in a direction parallel to, for example, the channel width direction is connected to a laminated film in which the polysilicon film 1, the barrier metal film 102, and the metal film 101 are laminated from the lower layer side constituting the gate wire. In the example of FIGS. 1, 2, 3, and 5, four contact plugs 100a are connected to the laminated film constituting the gate wire of one of two transistors. Four contact plugs 100b are connected to the laminated film constituting the gate wire of the other of two transistors.

As shown in FIGS. 2, 3, and 5, the contact plug 100 is formed so as to reach the polysilicon film 1 in the laminated film constituting the gate wire and the bottom thereof is in contact with the polysilicon film 1. In addition, the contact plug 100 is arranged such that the surface thereof is in the same height position as the surface of the inter-level dielectric isolation 27. Thus, the top surface of the contact plug 100 (second contact plug) is formed in substantially the same height position as the top surface of the upper layer wire 15 (first upper layer wire). Similarly, the top surface of the contact plug 100 (second contact plug) is formed in substantially the same height position as the top surface of the upper layer wire 5 (second upper layer wire).

In the first embodiment, as described above, a configuration in which the contact plug 119 connected to the gate wire in the element isolation region is connected to the upper layer wire 5 and also the contact plug 100 is prevented from connecting to the upper layer wire 5 by being arranged apart from the upper layer wire 5 above or "in" the channel region inside the element region is adopted. By adopting such a configuration, compared with a case when the contact plug 100 is made to connect to the upper layer wire, the interval in the channel length direction between wiring patterns in the element region can be widened for the elimination of the need to lead about the upper layer wire 5 just above the contact plug 100. Thus, a dielectric breakdown voltage between the gate and the source or drain can be maintained at a higher level. As a result, a more reliable semiconductor element (transistor) can be realized.

Also in the first embodiment, a configuration in which the contact plug 100 reaching the polysilicon 1 is formed in the channel region inside the element region is adopted. Inside the element region, the conductive film 17 of polysilicon is arranged on the lower layer side of the polysilicon film 1 and so the polysilicon film itself is thick. Therefore, when the contact plug 100 is formed, the contact plug penetration into polysilicon and polysilicon damage by etching and the like during processing can easily be prevented. On the other hand, the conductive film 17 of polysilicon is not arranged on the lower layer side of the polysilicon film 1 inside the element isolation region and so the polysilicon film itself is relatively thin. Thus, when the contact plug 119 reaching the polysilicon 1 is formed inside the element isolation region, there is the possibility of contact plug penetration into polysilicon or polysilicon damage during the contact plug processing. In the first embodiment, as described above, by forming the contact plug 100 reaching the polysilicon film 1 in the channel region of the element region while the contact plug 119 in the element isolation region is formed apart from the polysilicon film 1 such that the bottom face thereof is in contact with the metal film 101, the contact plug penetration and polysilicon damage during processing can be prevented when compared a case in which the contact plug reaching the polysilicon film 1 is formed in the element isolation region.

The method of forming the contact plugs 10, 119, 100 and the upper layer wires 5, 15 is executed as described below. As a contact hole for the contact plug 10, a hole having the diameter of 20 nm or more and 200 nm or less is formed in the inter-level dielectric isolation 27 in the position above each of the diffusion layers 9 in the element region so as to pass through from the top surface of the inter-level dielectric isolation 27 to each of the diffusion layers 9. Further, a trench for the upper layer wire 15 is formed for each of the diffusion layers 9 in the position of the contact hole for the contact plug 10 halfway through the inter-level dielectric isolation 27 from the top surface of the inter-level dielectric isolation 27. The trench for the upper layer wire 15 is suitably formed in the width of, for example, 50 nm or more and 500 nm or less.

Then, as a contact hole for the contact plug 119, a hole having the diameter of 20 nm or more and 200 nm or less is formed in the inter-level dielectric isolation 27 in the position above the metal film 101 inside the element isolation region so as to pass through from the top surface of the inter-level dielectric isolation 27 to the metal film 101. Further, a trench for the upper layer wire 5 is formed in the position of the contact hole for the contact plug 119 in the element isolation region halfway through the inter-level dielectric isolation 27 from the top surface of the inter-level dielectric isolation 27. The trench for the upper layer wire 5 is suitably formed in the width of, for example, 50 nm or more and 500 nm or less.

Further, as a contact hole for the contact plug 100, a hole having the diameter of 20 nm or more and 200 nm or less is formed in the inter-level dielectric isolation 27 in the position above the metal film 101 inside the element region so as to pass through from the top surface of the inter-level dielectric isolation 27 to the polysilicon film 1.

In the above example, a case when a trench for the upper layer wire is formed after a contact hole is formed is shown, but a contact hole may be formed after a trench for the upper layer wire is formed. Also, a contact hole for the contact plug 10, a contact hole for the contact plug 119, and a contact hole for the contact plug 100 may be formed separately or simultaneously.

In a structure in which the polysilicon film 1 and the conductive film 17 of polysilicon are laminated, a crystal interface exists and the crystal interface of the polysilicon film 1 and the conductive film 17 can be split. Accordingly, treatment to remove a silicon oxide film, for example, fluoric acid treatment after a contact hole for the contact plug 100 is formed can be prevented from reaching the gate dielectric film 16 through the crystal interface. Thus, the depth of a contact hole for the contact plug 100 is desirably formed so as to stop in the polysilicon film 1 without reaching the conductive film 17.

Then, a barrier metal film 41 to be a portion of a wire material is formed by, for example, the sputter process to a thickness of, for example, 1 nm to 20 nm on the bottom face and the sidewall of the contact hole for the contact plug 10, the contact hole for the contact plug 119, and the contact hole for the contact plug 100 and also on the bottom face and the sidewall of the trench for the upper layer wire 5 and the trench for the upper layer wire 15. As the material of the barrier metal film 41, it is suitable to use at least one of titanium (Ti) and titanium nitride (TiN). Next, the contact hole for the contact plug 10, the contact hole for the contact plug 119, the contact hole for the contact plug 100, the trench for the upper layer wire 5, and the trench for the upper layer wire 15 covered with the barrier metal film 41 are filled with a conductive film 31 such as W or Cu, which is the same material as that of the metal film 101 of the gate wire. When the metal film 101 is W, the contact hole for the contact plug 10, the contact hole for the contact plug 119, the contact hole for the contact plug 100, the trench for the upper layer wire 5, and the trench for the upper layer wire 15 is filled with W to be the conductive film 31. When the metal film 101 is Cu, the contact hole for the contact plug 10, the contact hole for the contact plug 119, the contact hole for the contact plug 100, the trench for the upper layer wire 5, and the trench for the upper layer wire 15 is filled with Cu to be the conductive film 31.

When the holes are filled with W as the conductive film 31, for example, the sputter process may be used. When the holes are filled with Cu as the conductive film 31, a Cu thin film is formed by, for example, the sputter process as a seed film to a thickness of 1 nm to 20 nm on the bottom face and the sidewall of the contact hole for the contact plug 10, the contact hole for the contact plug 119, and the contact hole for the contact plug 100 and also on the bottom face and the sidewall of the trench for the upper layer wire 5 and the trench for the upper layer wire 15. Subsequently, the contact hole for the contact plug 10, the contact hole for the contact plug 119, the contact hole for the contact plug 100, the trench for the upper layer wire 5, and the trench for the upper layer wire 15 may be filled with Cu by electro-plating using the seed film as a cathode. After being filled with W or Cu, excessive W or Cu protruding from the contact hole for the contact plug 100, the trench for the upper layer wire 5, and the trench for the upper layer wire 15 and a barrier metal may be polished and removed by the CMP method. Accordingly, the height of the top surface of the upper layer wire 5 and the upper layer wire 15 and that of the contact plug 100 are aligned so that a foundation with a small step can be used when a still upper wire layer is formed. Therefore, the resistance of a contact plug or the resistance of a wire can be lowered.

In the first embodiment, as described above, the upper layer wire 5, the upper layer wire 15, the contact plug 10, the contact plug 119, and the contact plug 100 are suitably formed from the same material.

In the above example, a case when each contact hole and each trench for the upper layer are filled simultaneously is described, but the present embodiment is not limited to such an example. After each contact hole being formed and filled with a wire material, a trench for each upper layer wire may be formed to fill each trench with the same material as that of the contact hole.

In the first embodiment, as described above, the contact plug 100 (second contact plug) to connect the metal film 101 and the polysilicon film 1 is arranged above or "in" the channel region inside the element region. The contact plug 100 is formed so as to pass through the metal film 101 and also to pass through the barrier metal film 102 to reach the polysilicon film 1. The contact plug 100 is also formed such that Ti or TiN as the material of the barrier metal film 41 of the contact plug 100 is in contact with the polysilicon film 1. On the other hand, the material of the barrier metal film 102 is WN, TaN, or Ta, which is different from the material of the barrier metal of the contact plug 100. Ti or TiN used for the barrier metal of the contact plug 100 can form an ohmic contact of lower resistance to polysilicon than the material of the barrier metal film 102. Then, the metal film 101 and the contact plug 100 are formed from the same main material. That is, the resistance between the polysilicon film 1 and the contact plug 100 is made low and also the polysilicon film 1 is connected to the metal film 101 by the contact plug 100 without going through the barrier metal film 102. Thus, the wire resistance of the gate having a laminated structure of the metal layer, barrier metal layer, and polysilicon layer can be reduced.

Figures 6A, 6B:
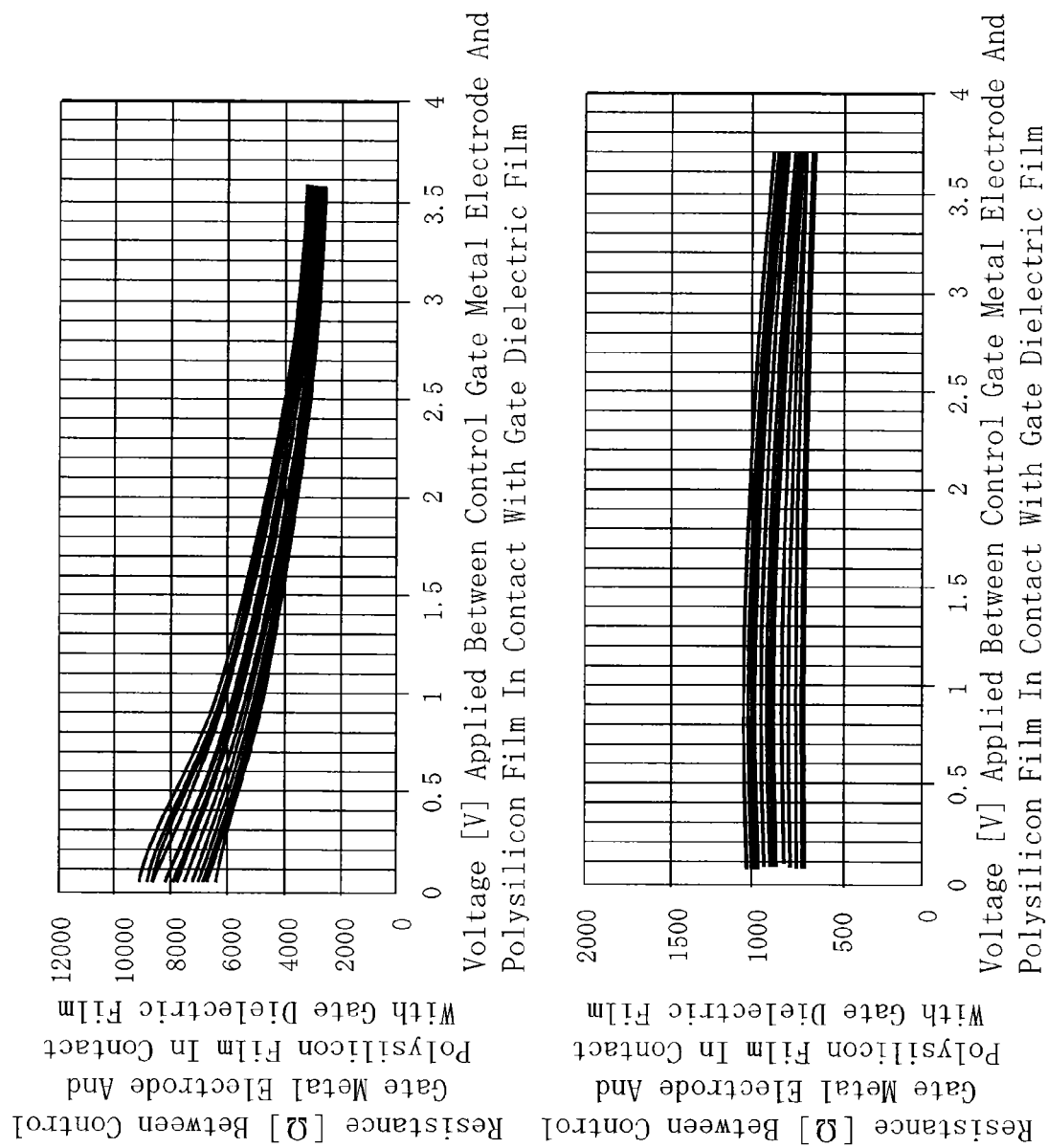
FIGS. 6A and 6B are graphs showing examples of interface resistance of a gate having a laminated structure in the order of a metal film, a barrier metal film, and a polysilicon film from the upper layer side in the first embodiment.

FIGS. 6A and 6B are graphs showing examples of wire resistance of a gate having a laminated structure in the order of a metal film, a barrier metal film, and a polysilicon film from the upper layer side in the first embodiment. In FIG. 6A, as a comparative example, the resistance between the polysilicon film and the metal film when a contact plug is formed from the upper layer wire in such a depth that the contact plug reaches the metal film without reaching the polysilicon film and reaching the barrier metal film at the deepest is shown. In FIG. 6A, the vertical axis represents the resistance between the polysilicon film and the metal film and the horizontal axis represents a voltage applied to between the polysilicon film and the metal film. As shown in FIG. 6A, it is clear that nonlinearity is large when the potential difference is 1 V or less and the resistance rises.

Further, it turns out that the resistance changes significantly depending on the composition of the barrier metal film in the intermediate position of the laminated structure, for example, by changing the flow rate of $N_2$ when a WN film is formed or the concentration of P or B of the polysilicon film in contact with the barrier metal film. It turns out that nonlinearity can be reduced particularly by increasing the concentration of P or B of the polysilicon film in contact with the barrier metal film so that the resistance as a whole can be reduced. However, it also turns out that rather than the above phenomena, the fact that a complete ohmic junction cannot be formed between the barrier metal film and the polysilicon film and there is a Schottky junction component is a real problem.

On the other hand, the composition of the barrier metal film in the intermediate position of the laminated structure unavoidably is such that Schottky barrier properties remain in order to reduce the wire resistance and control film quality of the metal film made of, for example, W formed thereon and also to prevent peeling due to a stress difference in the interface. Further, in consideration of a heating process of, for example, 800° C. or more to form the source and drain electrodes of a transistor, the barrier metal film in the intermediate position of the laminated structure is formed by using WN, TaN, or Ta having good heat resistance and high Schottky barrier properties. Thus, the resistance rises. Thus, when a contact plug is formed in such a depth that it reaches the metal film and reaches even the barrier metal film at the deepest like the comparative example, it is difficult to lower the resistance between the polysilicon film and the metal film.

In the first embodiment, by contrast, the contact plug 100 formed such that the metal film 101 is passed through, the barrier metal film 102 is also passed through, and the polysilicon film 1 is reached and using the same material as that of the metal film 101 as the main material is arranged. Further, the material of the barrier metal film 41 of the outer circumference of the sidewall and the bottom of the contact plug 100 is selected under the condition of using a material capable of forming an ohmic contact of lower resistance to polysilicon than the material of the barrier metal film 102. In FIG. 6B, the resistance between the polysilicon 1 (including the conductive film 17 of polysilicon) and the metal film 101 when, like in the first embodiment, the contact plug 100 is formed in such a depth that it reaches the polysilicon film 1 from the upper layer wire side is shown. In FIG. 6B, the vertical axis represents the resistance between the polysilicon film and the metal film and the horizontal axis represents the voltage applied to between the polysilicon film and the metal film. A contact plug of the same design dimension as that of the contact plug in FIG. 6A is formed as the contact plug. As the size of the contact plug, the design dimension of the diameter in the range of 30 nm to 90 nm is adopted. In the first embodiment, the contact plug 100 is formed after the heating process of, for example, 800° C. or more to activate impurities injected into the source and drain electrodes of a transistor. Thus, the barrier metal film 41 of the contact plug 100 can be formed by Ti or TiN whose thermal stability is lower than that of the barrier metal film 102 and capable of lowering the interface resistance. Thus, Ti or TiN whose interface resistance is lower is formed in direct contact with the polysilicon film 1 as the barrier metal of the contact plug 100 and thus, a better ohmic contact can be obtained. As a result, as shown in FIG. 6B, nonlinearity when the potential difference is 1 V or less is significantly reduced in the first embodiment and also the resistance in the entire voltage range can be made lower than the resistance of the comparative example in FIG. 6A.

Figure 7A:
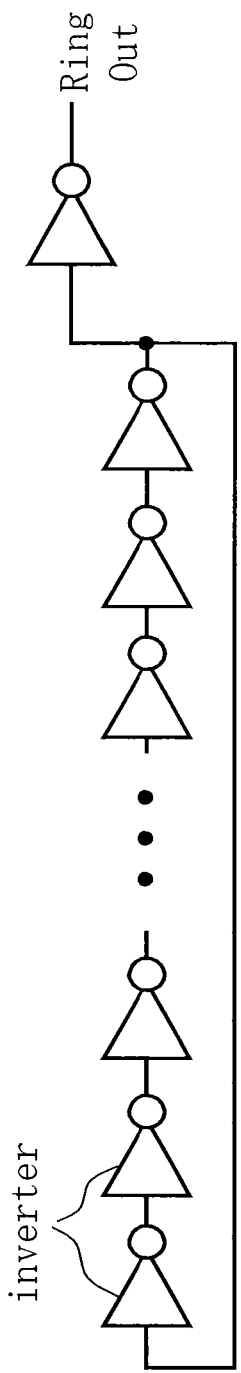
FIGS. 7A and 7B are examples of an oscillating circuit by an inverter chain to which the first embodiment is applicable and a circuit of one inverter, respectively.
Figure 7B:
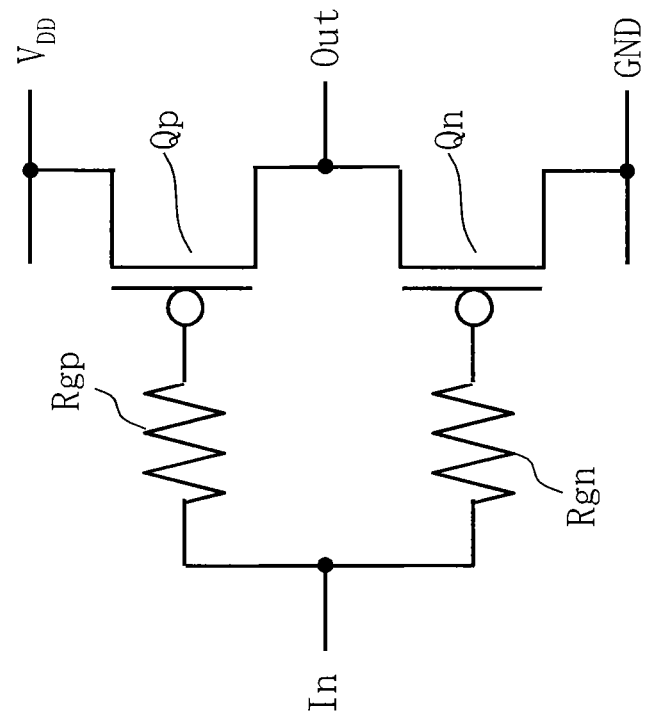

FIGS. 7A and 7B are examples of an oscillating circuit by an inverter chain to which the first embodiment is applicable and a circuit of one inverter, respectively. FIG. 7A shows an oscillating circuit by an inverter chain. Here, an oscillating circuit is formed by an odd number of inverters including a plurality of CMOS circuits being connected in series in a ring shape and an oscillating waveform is output as the output written as "Ring Out". An oscillation period is determined by the product of a delay time of each of the inverters and the number of connections and if the delay time of an inverter is further delayed or the delay time varies from inverter to inverter, the delay or variations of the oscillation period may arise so that the waveform of the correct period cannot be obtained. If the delay of variations of the oscillation period arises, a problem of a reduced margin of the operating speed of a circuit operating based on the output of the oscillating circuit is caused. FIG. 7B shows a circuit example of one inverter. An inverter is formed by a pMOS transistor Qp and an nMOS transistor Qn being connected in series. VDD is a positive power supply voltage, for example, between 1 V and 5 V, GND is a voltage node of 0 V, Out is an output terminal of the inverter, and In is an input terminal of the inverter. A parasitic resistance Rgp is inserted between the input terminal and the gate electrode of the transistor Qp and a parasitic resistance Rgn is inserted between the input terminal and the gate electrode of the transistor Qn. As the parasitic resistance, in addition to the wire resistance between the gate and the IN terminal, for example, a series resistance between WN and polysilicon to improve barrier properties of WN is present in a MOS type transistor having a gate in a laminated structure of, for example, the metal layer made of W, the barrier metal layer made of WN, and polysilicon. Due to such a resistance, when the IN terminal is pulse-driven by the voltage amplitude between 0 V and VDD, the switching speed of the transistor is limited by the larger of a time constant obtained by multiplying the gate capacitance of Qn by Rgn and a time constant obtained by multiplying the gate capacitance of Qp by Rgp.

If the contact plug 100 like in the first embodiment is not arranged, the resistance between WN and polysilicon corresponding to one component of Rgp, Rgn becomes a Schottky junction and voltage dependence of pulse waveforms due to the nonlinearity of the resistance arises so that the operating speed of an inverter changes considerably depending on VDD. Particularly when VDD becomes lower, a problem of an increased delay arises. Further, Rgn and Rgp take different values depending on an area where WN and polysilicon are in contact and the area contains a component that is different from the size of a product of the channel width and the gate length of a transistor only by the size of a gate fringe portion and thus, the delay time is different between transistors of the same channel width and gate length depending on the size of the gate fringe of the transistor, causing operating speed variations of the inverter. Further, if Rgp or Rgn varies depending on the impurity concentration of polysilicon or the film quality (composition) of WN, operation speed variations of the inverter arise.

To reduce the influence of varied delay times of the inverter, a method of increasing the operating speed by raising the power supply voltage VDD can be considered, but according to the method, power for driving an inverter increases and a current flowing through the power supply wire also increases, causing a problem of degradation of wire reliability and reliability of a transistor due to a temperature rise.

In contrast, in the first embodiment, the metal film 101 and the polysilicon film 1 of the gate wire are connected at low resistance through the contact plug 100 and therefore, the reduction of wire resistance of the gate wire and the reduction of interface resistance between the contact plug 100 and the polysilicon film 1 can be achieved at the same time. In the inverter logic circuit shown in FIG. 7B, as described above, when the IN terminal is pulse-driven by the voltage amplitude between 0 V and VDD, the switching speed of the transistor is limited by the larger of a time constant obtained by multiplying the gate capacitance of Qn by the series resistance component Rgn and a time constant obtained by multiplying the gate capacitance of Qp by the series resistance component Rgp. However, if the first embodiment is applied to the inverter logic circuit shown in FIG. 7B, Rgn and Rgp can be made smaller. Thus, the switching time of the inverter logic circuit can be made shorter so that a high-speed operation can be realized.

In addition, nonlinearity of the resistance between the barrier metal film 102 and the polysilicon film 1 as a component of Rgp, Rgn can be made smaller and thus, problems caused by pulse deformation and voltage dependence of pulse waveforms can be reduced. Therefore, the problem of big variations of the operating speed of the inverter depending on VDD and particularly a rapid increase of the delay when VDD is low can be reduced.

In the first embodiment, Rgn and Rgp are controlled so as to be low by the contact area and resistance of the contact plug 100 to the polysilicon film 1 and so the dependence of Rgn, Rgp on the size of the product of the channel width and gate length of the transistor and the size of the gate fringe portion can be made smaller. Therefore, the problem of different delay times of inverters depending on the size of the gate fringe of transistors even if the transistors have the same channel width and gate length can be reduced. Further, Rgp and Rgn can be reduced independently of the gate dimensions in a transistor requiring a higher-speed operation by adjusting the number of the contact plugs 100 so that the degree of freedom in design can be increased.

Further, the voltage dependence of resistance of Rgp, Rgn is small and more stable resistance can be realized regardless of impurity concentration variations of the polysilicon film 1 and film quality variations of the barrier metal film 102 so that operating speed variations of the inverter can be made smaller.

The effect of the first embodiment has been described by taking an inverter circuit as an example, but the present embodiment can be applied to logic circuits in general such as a NAND logic circuit and NOR logic circuit.

In the first embodiment, as described above, the contact plug 100 is formed in an isolated structure to which the upper layer wire 15 is not connected and having a width narrower than the wire layer. Accordingly, the contact plug 100 can be formed such that a wide distance to the neighboring upper layer wire 15 in the channel length direction can be maintained. Thus, the size of a transistor in the channel length direction can be made smaller. Accordingly, the distance from the contact plug 10 to the gate wire (gate electrode) on the source electrode and drain electrode can be made smaller so that a transistor of higher current drivabilities can be realized by decreasing the parasitic resistance of the source diffusion layer and the drain diffusion layer. Further, a large interval between the wire and the contact plug can be maintained and thus, a higher dielectric breakdown voltage can be maintained to be able to realize a more reliable semiconductor element. Even if the size of the transistor is made smaller, because a laminated structure in which the metal film 101 and the polysilicon film 1 are connected at low resistance via the barrier metal of the contact plug 100 is formed, a low-resistance gate wire in which the polysilicon film 1 is electrically connected in parallel by the metal film 101 and the contact plug 100 can be realized.

Because the delay time of the metal film 101 of low resistance and the delay time of the polysilicon film 1 of high resistance are significantly different between the metal film 101 and the polysilicon film 1 having significantly different resistances, the transmission speed when some frequency is given is different from frequency to frequency. Thus, when, for example, a pulse signal is applied to a structure in which the metal film 101 and the polysilicon film 1 are brought into contact via the barrier metal film 102 having a high interface resistance, a signal in the metal film 101 is not promptly propagated to the polysilicon film 1 via the barrier metal film 102 and a component propagating in the metal film 101 increases. Similarly, a signal once propagated to the polysilicon film 1 is less likely to be brought back to the metal film 101 via the barrier metal film 102 and a component propagating in the polysilicon film 1 as it is increases. Thus, each propagation velocity is significantly different and a voltage propagated from the polysilicon film 1 is propagated later than a voltage propagated from the metal film 101, which deforms the input pulse. In the first embodiment, a substantial sheet resistance in the channel width direction (direction in which the gate wire extends) of the polysilicon film 1 can be reduced without going through the barrier metal film 102 having a high interface resistance by the polysilicon film 1 being connected to the low-resistance metal film 101 via the contact plug 100 and a problem of input pulse deformation when the gate wire is formed long can be prevented. In other words, the problem of input pulse deformation when the gate wire is formed long due to velocity dispersion caused by a resistance difference between the polysilicon film 1 and the metal film 101 can be prevented.

Second Embodiment

In the first embodiment, a case when each of a plurality of the contact plugs 100 arranged in the channel width direction is formed independently in a noncontact manner is described. However, embodiments are not limited to such an example. In the second embodiment, a configuration in which a plurality of the contact plugs 100 arranged in the channel width direction is mutually connected will be described.

Figure 8:
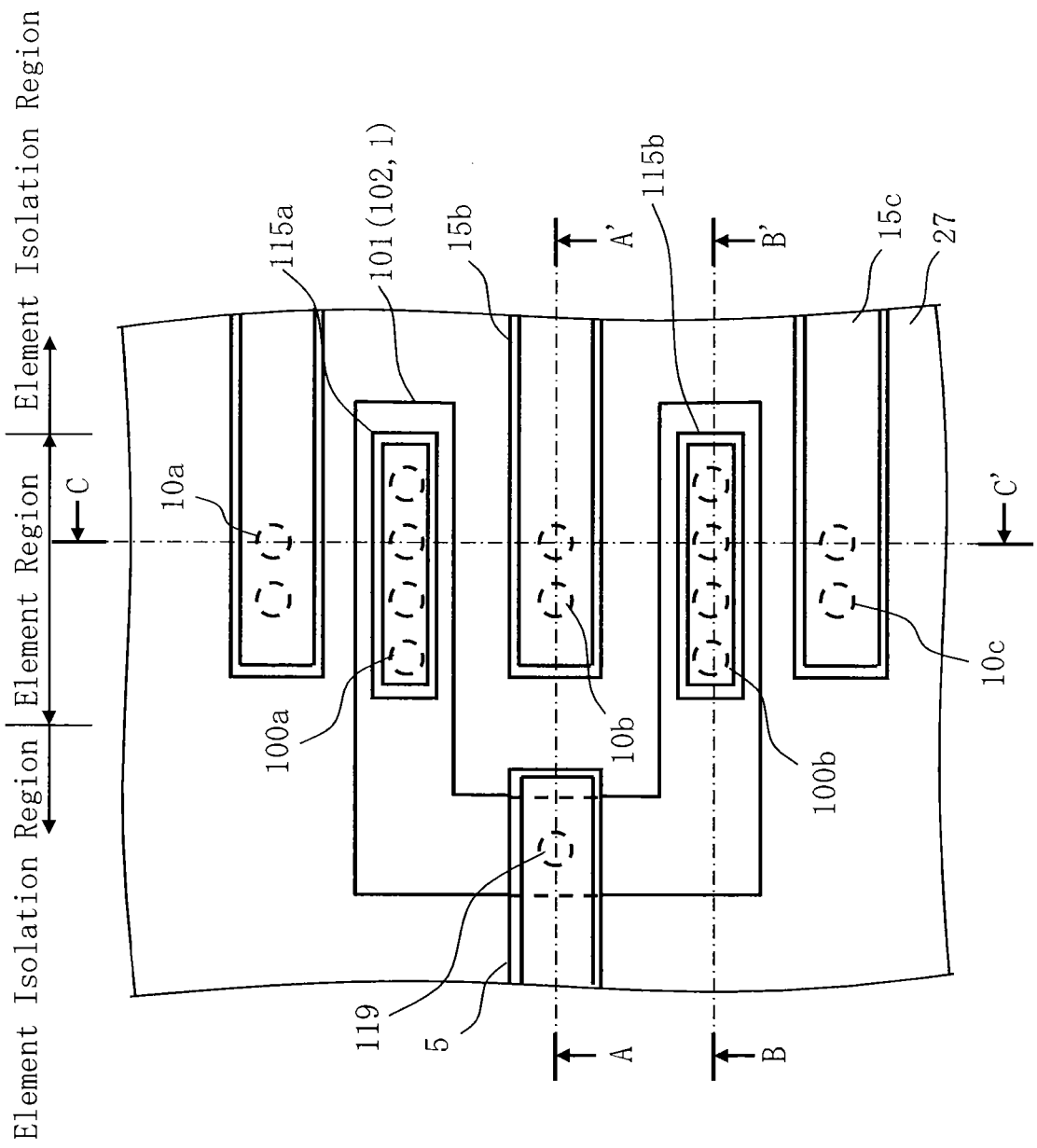
FIG. 8 is a top view showing the configuration of a semiconductor device according to a second embodiment.
Figure 9:
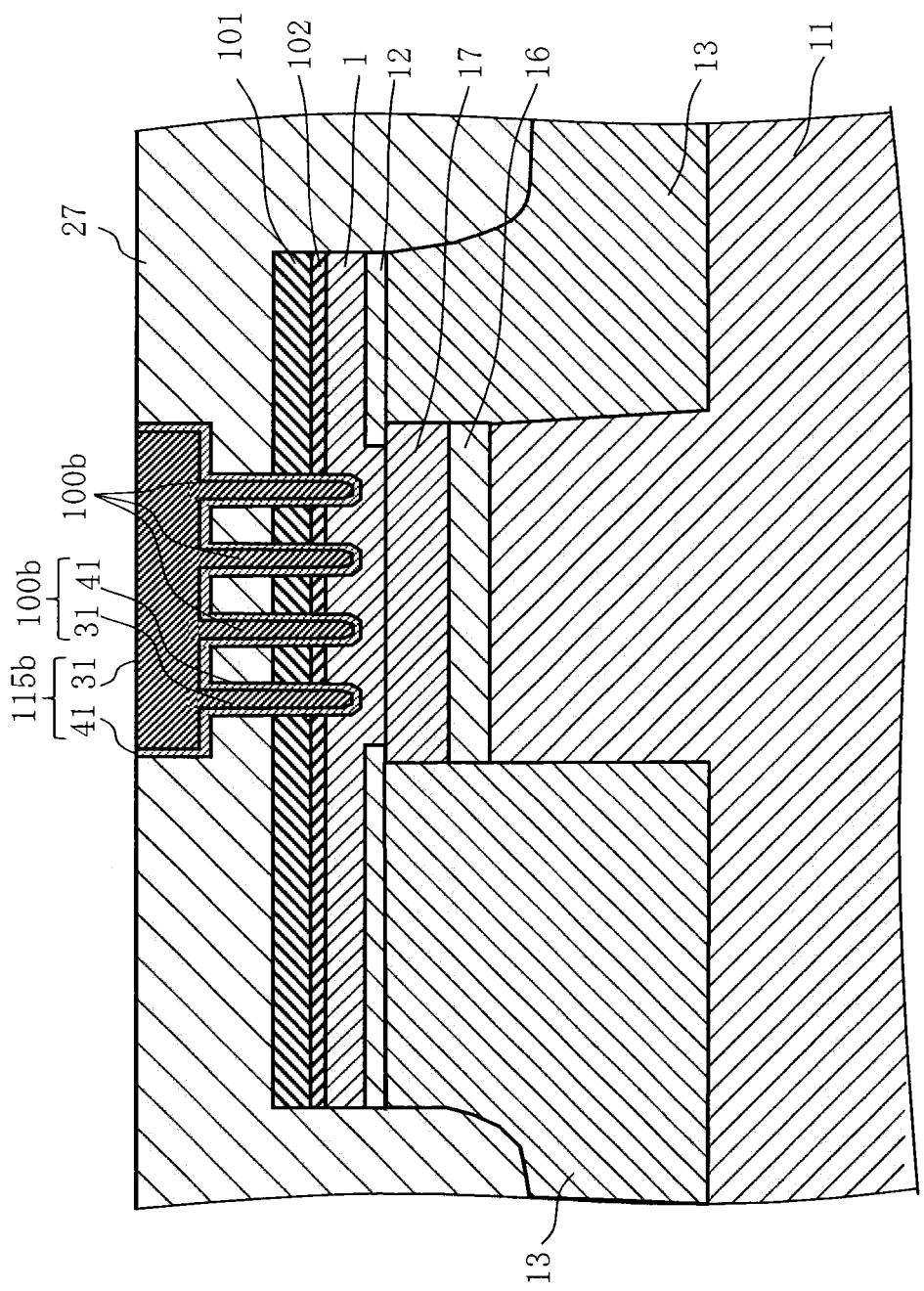
FIG. 9 is a sectional view showing a BB' cross section of the semiconductor device according to the second embodiment shown in FIG. 8.
Figure 10:
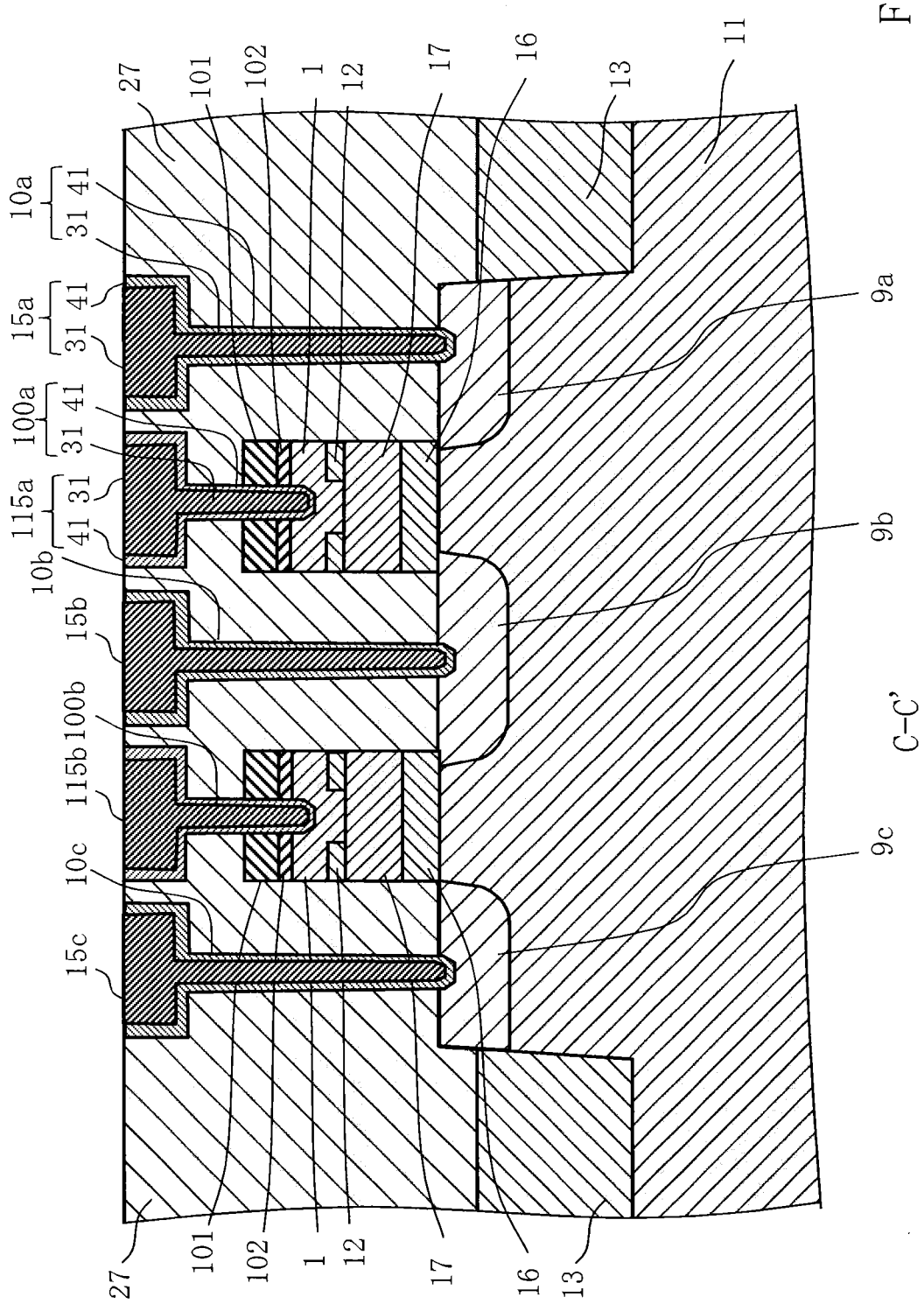
FIG. 10 is a sectional view showing a CC' cross section of the semiconductor device according to the second embodiment shown in FIG. 8.

FIG. 8 is a top view showing the configuration of a semiconductor device according to the second embodiment. FIG. 9 is a sectional view showing a BB' cross section of the semiconductor device according to the second embodiment shown in FIG. 8. FIG. 10 is a sectional view showing a CC' cross section of the semiconductor device according to the second embodiment shown in FIG. 8. A sectional view showing an AA' cross section of the semiconductor device according to the second embodiment shown in FIG. 8 is the same as FIG. 4.

In the second embodiment, as shown in FIGS. 8, 9, and 10, an upper layer wire 115 connecting a plurality of the contact plugs 100 arranged in the channel width direction is arranged above the plurality of the contact plugs 100 arranged in the channel width direction. In the example of FIGS. 8, 9, and 10, four contact plugs 100a are connected to an upper layer wire 115a and four contact plugs 100b are connected to an upper layer wire 115b. The upper layer wire 115 is configured independently without being connected to the upper layer wire 5. The upper layer wire 115 is arranged such that the surface thereof is in the same height position as the surface of the inter-level dielectric isolation 27. That is, the upper layer wire 115 is arranged such that the surface thereof is in substantially the same height position as the surface of the upper layer wires 5, 15. By electrically connecting the plurality of the contact plugs 100 arranged in the channel width direction mutually by the upper layer wire 115, the potential between the contact plugs 100 can be maintained constant so that the wire resistance of the gate wire can further be reduced. Therefore, a transistor operating faster than in the first embodiment can be realized by reducing the wire resistance of the gate wire by the upper layer wire 115. Other configurations of a semiconductor device in the second embodiment are the same as in the first embodiment.

As the formation method thereof, after a contact hole for the contact plug 100 is formed, a trench for the upper layer wire 115 is formed in the position of the contact hole for the contact plug 100 halfway through the inter-level dielectric isolation 27 from the top surface of the inter-level dielectric isolation 27. The trench for the upper layer wire 115 is suitably formed in the width of, for example, 50 nm or more and 500 nm or less. Then, the barrier metal film 41 of titanium (Ti) or titanium nitride (TiN) to be a portion of the wire material is formed by, for example, the sputter process to a thickness of, for example, 1 nm to 20 nm on the bottom face and the sidewall of the contact hole for the contact plug 10, the contact hole for the contact plug 119, and the contact hole for the contact plug 100 and also on the bottom face and the sidewall of the trench for the upper layer wire 115, the trench for the upper layer wire 5, and the trench for the upper layer wire 15. Next, the contact hole for the contact plug 10, the contact hole for the contact plug 119, the contact hole for the contact plug 100, the trench for the upper layer wire 115, the trench for the upper layer wire 5, and the trench for the upper layer wire 15 covered with the barrier metal film 41 are filled with the conductive film 31 such as W or Cu, which is the same material as that of the metal film 101 of the gate wire. By forming the trench for the upper layer wire 115 after the contact hole for the contact plug 100 being formed, the contact hole for the contact plug 100 is further etched together when the trench for the upper layer wire 115 is etched and therefore, the contact hole for the contact plug 100 can be formed more deeply. Thus, Ti or TiN as the barrier metal film 41 of the contact plug 100 can more easily be formed to be in contact with the polysilicon film 1 in a wider area so that the contact plug 100 having a lower resistance than in the first embodiment can be formed.

In the above example, a case when a trench for the upper layer wire is formed after a contact hole is formed is shown, but a contact hole may be formed after a trench for the upper layer wire is formed.

Third Embodiment

In the first and second embodiments, a configuration in which a plurality of the contact plugs 100 in a circular shape or a rectangular shape close to a square is arranged in the channel width direction is described. In the third embodiment, a configuration in which a contact plug in a shape extending long along the channel width direction is arranged will be described.

Figure 11:
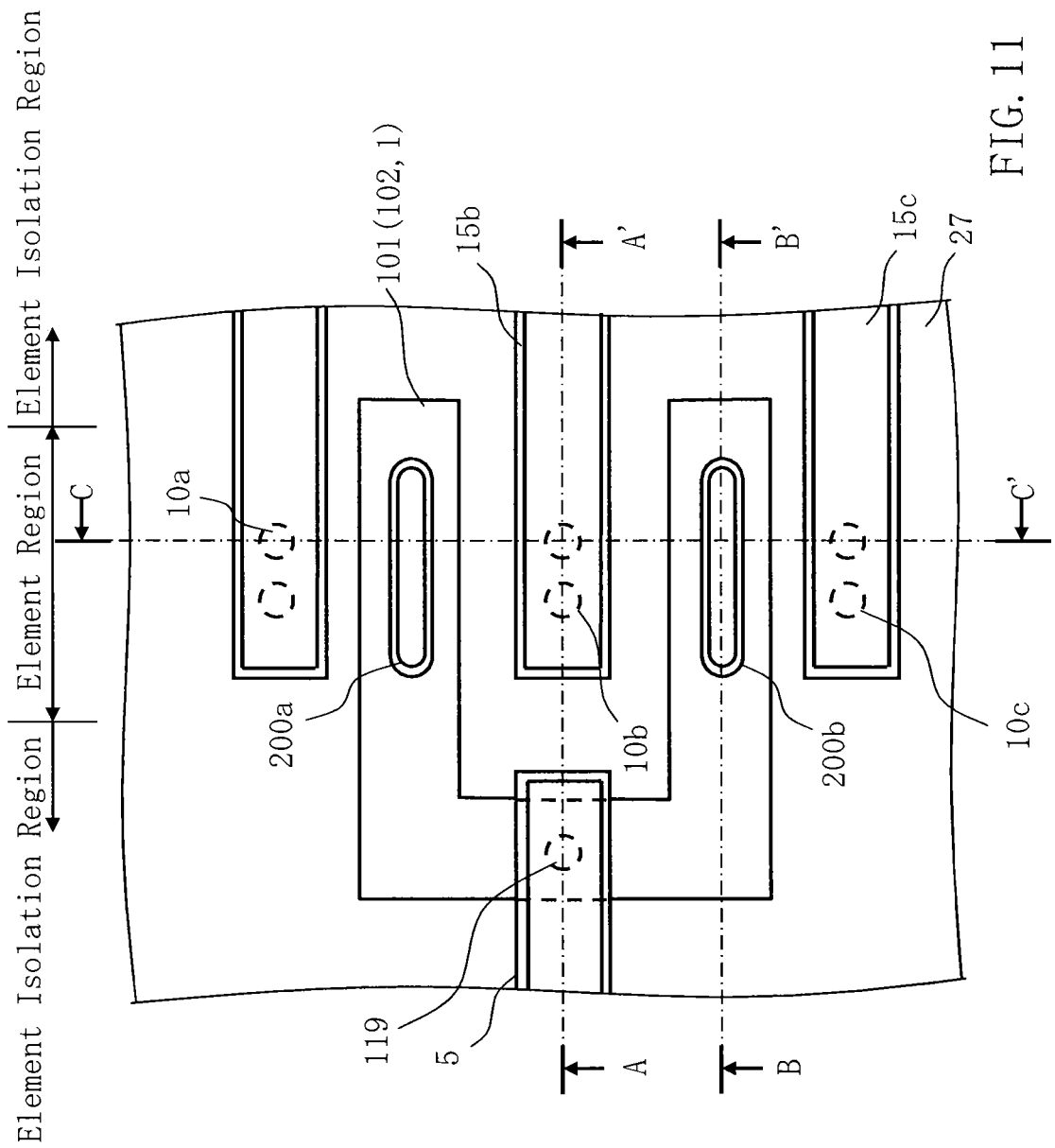
FIG. 11 is a top view showing the configuration of a semiconductor device according to a third embodiment.
Figure 12:
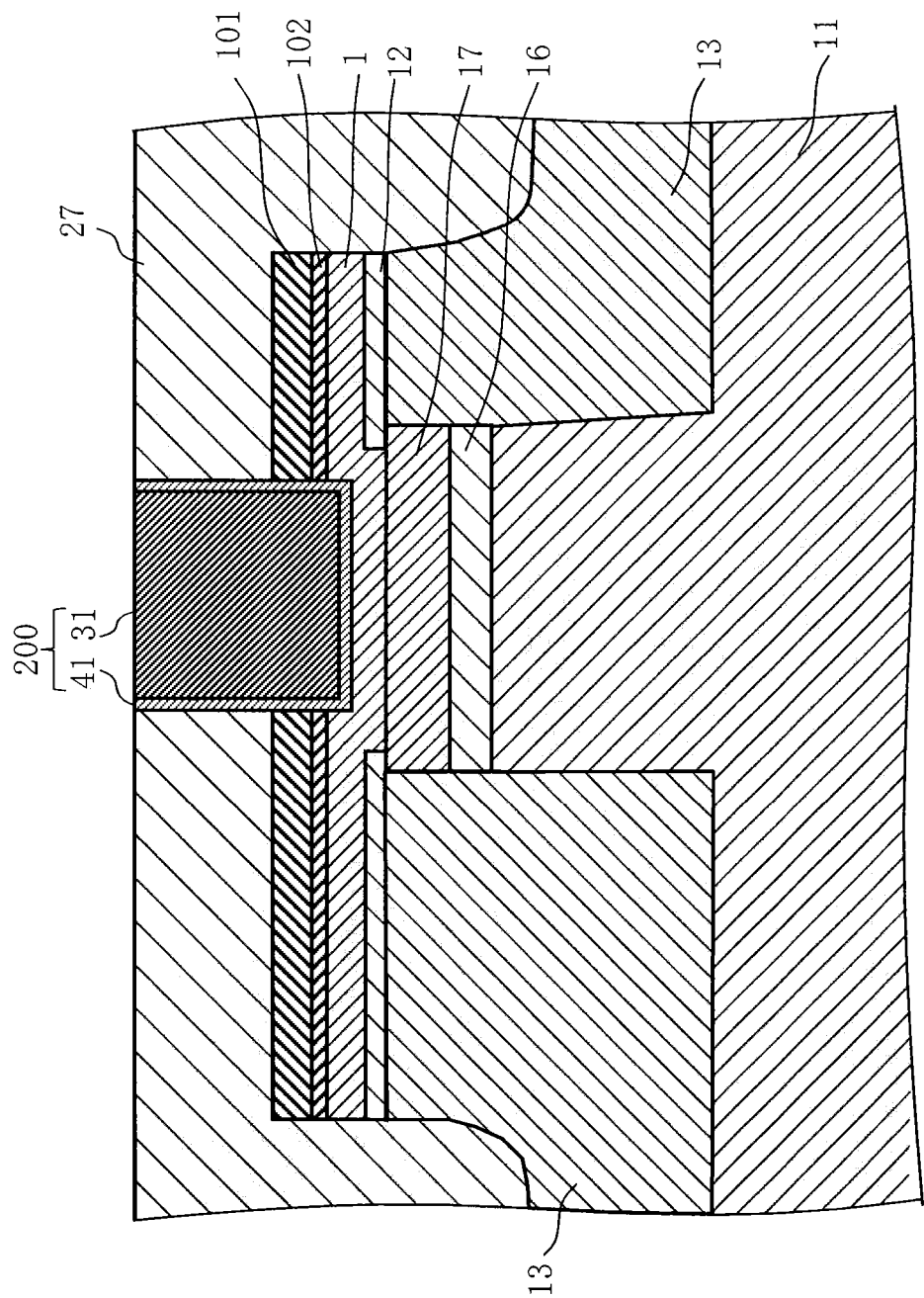
FIG. 12 is a sectional view showing a BB' cross section of the semiconductor device according to the third embodiment shown in FIG. 11.
Figure 13:
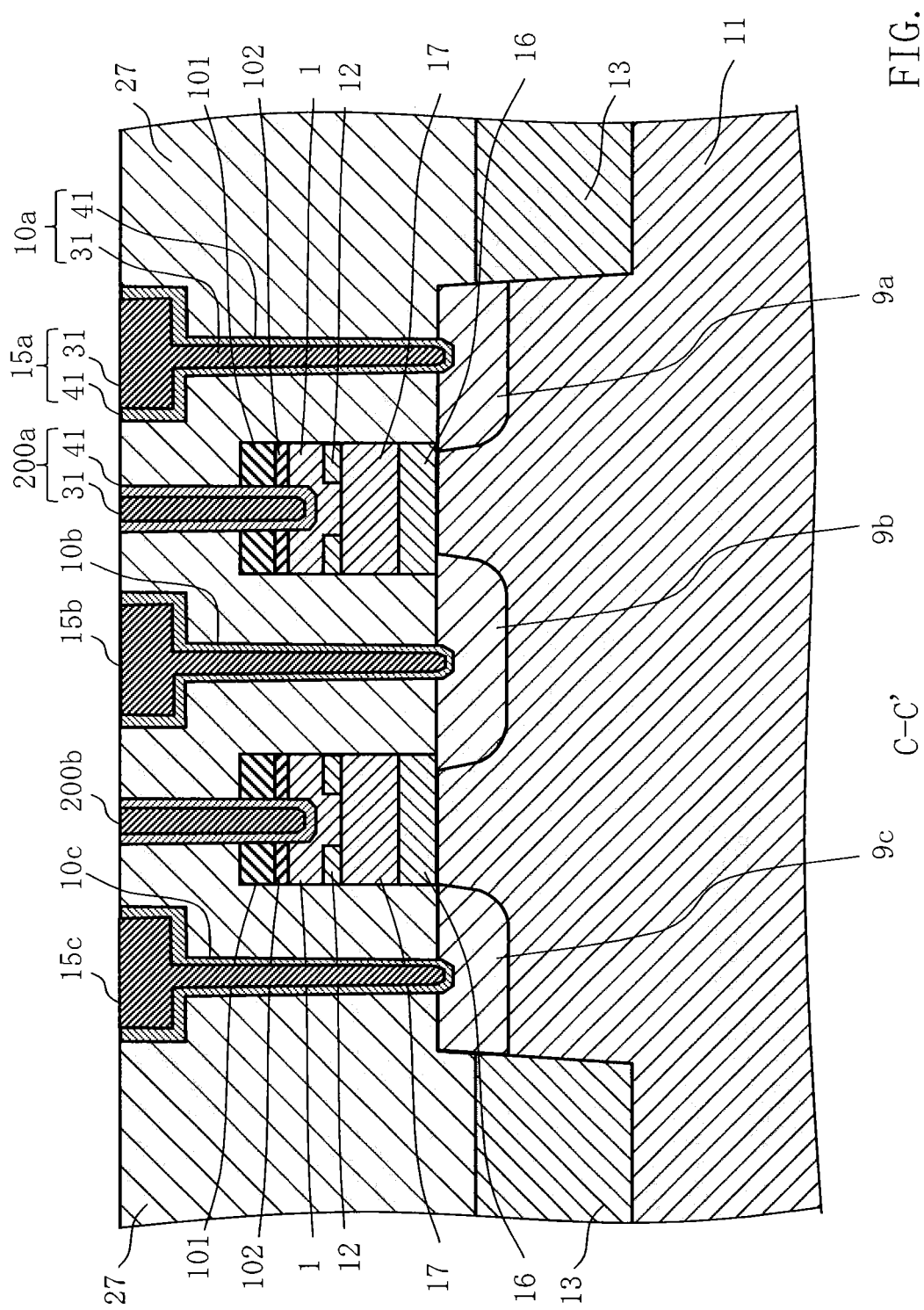
FIG. 13 is a sectional view showing a CC' cross section of the semiconductor device according to the third embodiment shown in FIG. 11.

FIG. 11 is a top view showing the configuration of a semiconductor device according to the third embodiment. FIG. 12 is a sectional view showing a BB' cross section of the semiconductor device according to the third embodiment shown in FIG. 11. FIG. 13 is a sectional view showing a CC' cross section of the semiconductor device according to the third embodiment shown in FIG. 11. A sectional view showing an AA' cross section of the semiconductor device according to the third embodiment shown in FIG. 11 is the same as FIG. 4.

In the third embodiment, instead of the plurality of the contact plugs 100 shown in the first and second embodiments, as shown in FIGS. 11, 12, and 13, a contact plug 200 (second contact plug) connecting the metal film 101 and the polysilicon film 1 in the channel region is arranged. That is, a contact plug 200a is formed, instead of the four contact plugs 100a, and a contact plug 200b is formed, instead of the four contact plugs 100b. The contact plug 200 is formed in dimensions so as to be longer in the channel width direction than in the channel length direction and longer than the contact plug 10 in the channel width direction. The contact plug 200 is arranged such that the surface thereof is in the same height position as the surface of the inter-level dielectric isolation 27. That is, the contact plug 200 is arranged such that the surface thereof is in substantially the same height position as the surface of the upper layer wires 5, 15. In the third embodiment, the contact plug 200 is suitably formed in such a way that the size thereof is larger than the contact plug 10 or the contact plug 119 in width or length when viewed from the top surface. Particularly, a structure in which the contact plug 200 is long in the channel width direction in which the gate wire extends is desirable because a wide plane distance in the channel length direction between the contact plug 200 and the upper layer wire 15 on the source electrode or drain electrode can be maintained. Other configurations of a semiconductor device in the third embodiment are the same as in the first embodiment.

As the formation method thereof, a hole whose long diameter (width in the channel width direction) is 40 nm or more and 3000 nm or less and whose short diameter (width in the channel length direction) is 20 nm or more and 200 nm or less is formed in the position of the metal film 101 in the element region in the inter-level dielectric isolation 27 to pass through from the top surface of the inter-level dielectric isolation 27 to the polysilicon film 1 as a contact trench for the contact plug 200. Then, the barrier metal film 41 of titanium (Ti) or titanium nitride (TiN) to be a portion of a wire material is formed by, for example, the sputter process to a thickness of, for example, 1 nm to 20 nm on the bottom face and the sidewall of the contact hole for the contact plug 10, the contact hole for the contact plug 119, and the contact trench for the contact plug 200 and also on the bottom face and the sidewall of the trench for the upper layer wire 5 and the trench for the upper layer wire 15. Next, the contact hole for the contact plug 10, the contact hole for the contact plug 119, the contact trench for the contact plug 200, the trench for the upper layer wire 5, and the trench for the upper layer wire 15 covered with the barrier metal film 41 are filled with the conductive film 31 such as W or Cu, which is the same material as that of the metal film 101 of the gate wire.

By adopting such a configuration, a contact area between the contact plug 200 and the polysilicon film 1 can be increased when compared with the first embodiment and therefore, a still lower-resistance contact plug can be realized.

In the third embodiment, the contact plug 200 is suitably formed in such a way that the size thereof is, for example, 1.3 times or more larger than the contact plug 10 or the contact plug 119 in width or length when viewed from the top surface. Because the contact plug 200 is, for example, 1.3 times or more larger, the simultaneous formation of a contact trench of the contact plug 200 can be made easier when a contact hole for the contact plug 10 or a contact hole for the contact plug 119 is formed. Because etching of a contact trench of the contact plug 200 having a wide long diameter proceeds faster due to a micro loading effect, this is effective when holes of different depths or conditions are formed at the same time. Here, the micro loading effect is used so that a contact trench for the contact plug 200 in which etching reaches the polysilicon film 1 by passing through the metal film 101 and the barrier metal film 102 below the inter-level dielectric isolation 27 and a contact hole for the contact plug 10 and a contact hole for the contact plug 119 in which etching is stopped in the diffusion layer 9 or the metal film 101 below the inter-level dielectric isolation 27 can be formed at a time. In the first to third embodiments, a contact hole for the contact plug 10 and a contact hole for the contact plug 119 having equal dimensions are formed in mutually different depths and such a configuration can be formed by selective etching conditions under which the etching speed of the metal film 101 and the barrier metal film 102 below the inter-level dielectric isolation 27 is slower than the etching speed of the inter-level dielectric isolation 27. Alternatively, such a structure can also be formed by, after a gate in a laminated structure being formed and source and drain electrodes being formed, for example, arranging a silicon nitride film or silicon oxynitride film (not show) to serve as an etching stopper when a contact hole or contact trench is etched in the range of 5 nm to 100 nm below the inter-level dielectric isolation 27. Further in the third embodiment, a structure in which the depth of a rectangular contact hole for the contact plug 10 of small dimensions becomes still deeper with respect to a contact trench of the contact plug 200 having a wide long diameter can be formed.

In the third embodiment, like in the first embodiment, an upper layer wire is not connected to the contact plug 200. Thus, the contact plug 200 can be made an isolated structure whose width in the channel length direction is smaller than the upper layer wire layer. Thus, a wide distance in the channel length direction between the contact plug 200 and the upper layer wire 15 can be maintained and the period of the transistor in the channel length direction can be made small without being limited by the wire pattern. Accordingly, the distance from the contact plug 10 on the source electrode and drain electrode to the gate electrode can be made smaller so that a transistor of higher current drivabilities can be realized by decreasing the resistance of the source diffusion layer and the drain diffusion layer. Further, a large interval between the wire and the contact plug can be maintained and thus, a higher dielectric breakdown voltage can be maintained to be able to realize a more reliable semiconductor element. Even if the size of the transistor is made smaller, because a laminated structure in which the metal film 101 and the polysilicon film 1 are connected at low resistance via the barrier metal of the contact plug 200 is formed, a low-resistance gate wire in which the polysilicon film 1 is electrically connected by the metal film 101 and the contact plug 200 can be realized. Accordingly, the problem of input pulse deformation when the gate wire is formed long due to velocity dispersion caused by a resistance difference between the polysilicon film 1 and the metal film 101 can be prevented by reducing the substantial sheet resistance in the channel width direction of the polysilicon film 1 by forming the contact plug 200 long in the channel width direction.

In the foregoing, the embodiments have been described with reference to concrete examples. However, the present disclosure is not limited to such concrete examples. For example, as the method of forming the element isolation dielectric film 13, in addition to the method of converting silicon in a silicon containing gas into a silicon oxide film or silicon nitride film by the CVD method, for example, a method of injecting oxygen ions into deposited silicon or a method of oxidizing deposited silicon may be used.

The block dielectric film 12 suitably uses, for example, $TiO_2$ as TiOx. Also, for example, HfAlO is suitably used as HfAlOx. In addition, as the material of the block dielectric film 12, HfSiO, tantalum oxide film, strontium titanate, barium titanate, lead-zirconate-titanate, silicon oxynitride film, silicon nitride film, or a laminated film of the above materials of the block dielectric film 12 may also be used.

A p-type Si substrate is used as the semiconductor substrate 11, but other single-crystal semiconductor substrates containing silicon such as an SiGe mixed crystal, SiGeC mixed crystal or the like may also be used. Instead of the conductive film 17 of polysilicon, the conductive film 17 using amorphous Si, amorphous SiGe, or amorphous SiGeC or the conductive film 17 in a laminated structure thereof may also be used.

The above embodiments have been described by taking a case of the NAND type flash memory as an example. However, the above embodiments can also be applied to, for example, a 3Tr-NAND type flash memory in which the number of memory cell transistors in a NAND type flash memory is 1 and a NOR type flash memory. The above embodiments can also be applied to a 2Tr type flash memory obtained by eliminating a drain-side selection transistor from a 3Tr-NAND type flash memory and can also be widely applied to nonvolatile semiconductor memories in general including a laminated gate structure.

As the transistor in the above embodiments, nMOSFET is taken as an example, but the embodiments can also be applied to pMOSFET or to nMOSFET and pMOSFET at the same time in a CMOS circuit.

In addition, all semiconductor devices and methods for fabricating a semiconductor device that include elements of the present disclosure and whose design can be changed as appropriate by persons skilled in the art are also included in the scope of the disclosure.

While techniques normally used in the semiconductor industry such as a cleaning before and after treatment are not described for convenience of description, it is needless to say that such techniques are included in the scope of the present disclosure.

While certain embodiments have been described, these embodiments have been presented by way of example only, and are not intended to limit the scope of the inventions. Indeed, the novel methods and devices described herein may be embodied in a variety of other forms; furthermore, various omissions, substitutions and changes in the form of the methods and devices described herein may be made without departing from the spirit of the inventions. The accompanying claims and their equivalents are intended to cover such forms or modifications as would fall within the scope and spirit of the inventions.

What is claimed is:

1. A semiconductor device comprising:
    a gate wire extending from a channel region into an element isolation region and including a laminated film in which a polysilicon film, a barrier conductive film, and a metal film are laminated in this order from a lower layer side;
    a first contact plug connected to a source or a drain adjacent to the channel region;
    a first upper layer wire arranged above the source or the drain and connected to the first contact plug;
    a second upper layer wire arranged above the element isolation region;
    a second contact plug arranged apart from the second upper layer wire and connecting the metal film and the polysilicon film above the channel region; and
    a third contact plug formed apart from the polysilicon film in the element isolation region and connecting the second upper layer wire and the metal film, wherein the second contact plug includes a barrier metal in contact with the polysilicon film and the barrier conductive film in the gate wire is made of at least one of tungsten nitride (WN), tantalum nitride (TaN), and tantalum (Ta) and the barrier metal in the second contact plug is made of at least one of titanium (Ti) and titanium nitride (TiN).

2. The device according to claim 1, wherein a top surface of the second contact plug is formed in substantially a same height position as a top surface of the first upper layer wire.

3. The device according to claim 1, wherein the first upper layer wire, the first contact plug, and the second contact plug are formed from a same material.

4. The device according to claim 3, wherein the second upper layer wire and the third contact plug are formed from the same material as that of the second contact plug.

5. The device according to claim 1, wherein a top surface of the second contact plug is formed in substantially a same height position as a top surface of the second upper layer wire.

6. The device according to claim 5, wherein a bottom face of the second contact plug is in contact with the polysilicon film and a bottom face of the third contact plug is in contact with the metal film.

7. The device according to claim 1, wherein a bottom face of the second contact plug is in contact with the polysilicon film and a bottom face of the third contact plug is in contact with the metal film.

8. The device according to claim 1, wherein a thickness of the polysilicon film above the channel region is formed thicker than a thickness of the polysilicon film above the element isolation region.

9. The device according to claim 1, further comprising at least one another second contact plug as same as the second contact plug, formed above the channel region.

10. The device according to claim 9, further comprising: a third upper layer wire arranged above the channel region and connected to a plurality of second contact plugs including the second contact plug and the at least one another second contact plug.

11. The device according to claim 10, wherein the third upper layer wire is arranged in a noncontact manner from the first and second upper layer wires.

12. The device according to claim 11, wherein a top surface of the third upper layer wire is formed in substantially a same height position as a top surface of the first and second upper layer wires.

13. The device according to claim 12, wherein a plurality of second contact plugs including the second contact plug and the at least one another second contact plug are arranged toward a channel width direction.

14. The device according to claim 11, wherein a plurality of second contact plugs including the second contact plug and the at least one another second contact plug are arranged toward a longitudinal direction of the gate wire extending from the channel region into the element isolation region.

15. A semiconductor device comprising:
a gate wire including a laminated film in which a polysilicon film, a barrier conductive film, and a metal film are laminated in this order from a lower layer side above a channel region;
a first contact plug connected to a source or a drain adjacent to the channel region;
a first upper layer wire arranged above the source or the drain and connected to the first contact plug; and
a second contact plug connecting the metal film and the polysilicon film above the channel region and formed in dimensions so as to be longer in a channel width direction than in a channel length direction and to be longer than the first contact plug in the channel width direction,
wherein the second contact plug includes a barrier metal in contact with the polysilicon film and the barrier conductive film in the gate wire is made of at least one of tungsten nitride (WN), tantalum nitride (TAN), and tantalum (Ta) and the barrier metal in the second contact plug is made of at least one of titanium (Ti) and titanium nitride (TIN),
wherein the gate wire extends from the channel region into an element isolation region, and
wherein the device further comprising a third contact plug formed apart from the polysilicon film and in contact with the metal film in the element isolation region and a second upper layer wire connecting to the third contact plug.

16. The device according to claim 15, wherein a top surface of the second contact plug is formed in substantially a same height position as a top surface of the first upper layer wire.

17. The device according to claim 15, wherein the first upper layer wire, the first contact plug, and the second contact plug are formed from a same material.

18. The device according to claim 15, wherein a thickness of the polysilicon film above the channel region is formed thicker than a thickness of the polysilicon film above the element isolation region.

19. The device according to claim 15, wherein a bottom face of the second contact plug is in contact with the polysilicon film and a bottom face of the third contact plug is in contact with the metal film.

* * * * *